(12) United States Patent
Huang et al.

(10) Patent No.: US 10,699,981 B2
(45) Date of Patent: Jun. 30, 2020

(54) NON-VERTICAL THROUGH-VIA IN PACKAGE

(71) Applicant: Taiwan Semiconductor Manufacturing Company, Ltd., Hsinchu (TW)

(72) Inventors: Cheng-Lin Huang, Hsinchu (TW); Jung-Hua Chang, Hsinchu (TW); Jy-Jie Gau, Hsinchu (TW); Jing-Cheng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/173,210

(22) Filed: Oct. 29, 2018

(65) Prior Publication Data
US 2019/0067146 A1 Feb. 28, 2019

Related U.S. Application Data

(63) Continuation of application No. 14/658,968, filed on Mar. 16, 2015, now Pat. No. 10,115,647.

(51) Int. Cl.
*H01L 21/00* (2006.01)
*H01L 23/31* (2006.01)
(Continued)

(52) U.S. Cl.
CPC ........ *H01L 23/3128* (2013.01); *H01L 21/486* (2013.01); *H01L 23/49811* (2013.01); *H01L 23/49827* (2013.01); *H01L 23/5389* (2013.01); *H01L 24/19* (2013.01); *H01L 24/20* (2013.01); *H01L 24/97* (2013.01); *H01L 25/105* (2013.01); *H01L 25/50* (2013.01); *H01L 21/568* (2013.01); *H01L 23/49816* (2013.01); *H01L 24/32* (2013.01); *H01L 24/48* (2013.01); *H01L 24/73* (2013.01); *H01L 24/83* (2013.01); *H01L 24/92* (2013.01); *H01L 25/0657* (2013.01); *H01L 2224/04042* (2013.01); *H01L 2224/04105* (2013.01); *H01L 2224/12105* (2013.01);
(Continued)

(58) Field of Classification Search
CPC ..... H01L 2224/32145; H01L 2924/181; H01L 2224/83; H01L 23/5389; H01L 23/5386
USPC ......................................... 438/107, 108, 109
See application file for complete search history.

(56) References Cited

U.S. PATENT DOCUMENTS 5,341,979 A 8/1994 Gupta
6,814,584 B2 11/2004 Zaderej
(Continued)

FOREIGN PATENT DOCUMENTS

CN 1429419 A 7/2003
CN 103000573 A 3/2013
(Continued)

*Primary Examiner* — S. V. Clark
(74) *Attorney, Agent, or Firm* — Slater Matsil, LLP

(57) ABSTRACT

A package includes a device die, a through-via having a sand timer profile, and a molding material molding the device die and the through-via therein, wherein a top surface of the molding material is substantially level with a top surface of the device die. A dielectric layer overlaps the molding material and the device die. A plurality of redistribution lines (RDLs) extends into the dielectric layer to electrically couple to the device die and the through-via.

20 Claims, 30 Drawing Sheets

(51) Int. Cl.
*H01L 23/498* (2006.01)
*H01L 21/48* (2006.01)
*H01L 23/538* (2006.01)
*H01L 23/00* (2006.01)
*H01L 25/10* (2006.01)
*H01L 25/00* (2006.01)
*H01L 21/56* (2006.01)
*H01L 25/065* (2006.01)

(52) U.S. Cl.
CPC ............ *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00014* (2013.01); *H01L 2924/14* (2013.01); *H01L 2924/1431* (2013.01); *H01L 2924/1434* (2013.01); *H01L 2924/1436* (2013.01); *H01L 2924/1437* (2013.01); *H01L 2924/15311* (2013.01); *H01L 2924/181* (2013.01)

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,710,639 B2* | 4/2014 | Kikuchi | H01L 21/6835 |
| | | | 257/679 |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,796,846 B2 | 8/2014 | Lin et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,736,927 B2* | 8/2017 | Cho | H05K 1/0271 |
| 2005/0064707 A1 | 3/2005 | Sinha | |
| 2007/0148819 A1* | 6/2007 | Haba | H01L 25/105 |
| | | | 438/107 |
| 2011/0241193 A1 | 10/2011 | Ding et al. | |
| 2011/0291288 A1 | 12/2011 | Wu et al. | |
| 2013/0026468 A1 | 1/2013 | Yoshimuta et al. | |
| 2013/0026632 A1 | 1/2013 | Kikuchi et al. | |
| 2013/0062736 A1 | 3/2013 | Brighton et al. | |
| 2013/0062760 A1 | 3/2013 | Hung et al. | |
| 2013/0062761 A1 | 3/2013 | Lin et al. | |
| 2013/0105991 A1* | 5/2013 | Gan | H01L 25/105 |
| | | | 257/777 |
| 2013/0157418 A1* | 6/2013 | Choi | H01L 23/49811 |
| | | | 438/127 |
| 2013/0168848 A1 | 7/2013 | Lin et al. | |
| 2013/0307140 A1 | 11/2013 | Huang et al. | |
| 2014/0183778 A1 | 7/2014 | Colonna et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2014/0374150 A1 | 12/2014 | Inagaki et al. | |
| 2015/0054173 A1* | 2/2015 | Kim | H01L 21/565 |
| | | | 257/774 |
| 2016/0049330 A1 | 2/2016 | Peng | |
| 2016/0148861 A1* | 5/2016 | Liang | H01L 23/49517 |
| | | | 257/676 |

FOREIGN PATENT DOCUMENTS

| | | |
|---|---|---|
| CN | 104241241 A | 12/2014 |
| WO | 0189038 A2 | 11/2001 |

* cited by examiner

NON-VERTICAL THROUGH-VIA IN PACKAGE

PRIORITY CLAIM AND CROSS-REFERENCE

This application is a continuation of U.S. patent application Ser. No. 14/658,968, entitled "Non-Vertical Through-Via in Package," filed on Mar. 16, 2015, which application is incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
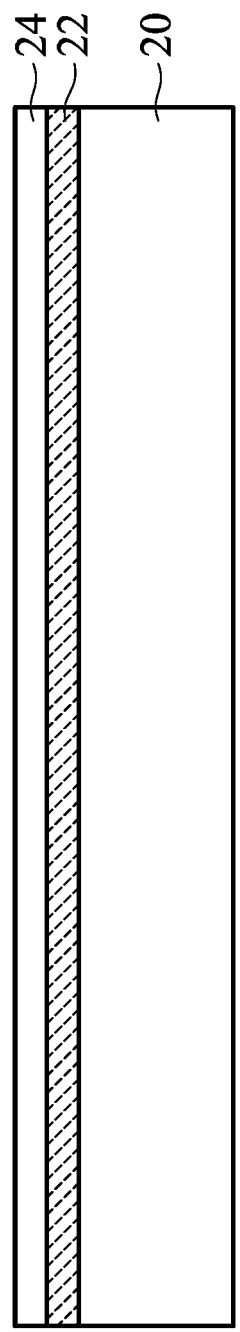
FIGS. 1 through 17 illustrate the cross-sectional views of intermediate stages in the packaging of a device die in accordance with some embodiments, with the respective through-vias having a sand timer profile.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 30:
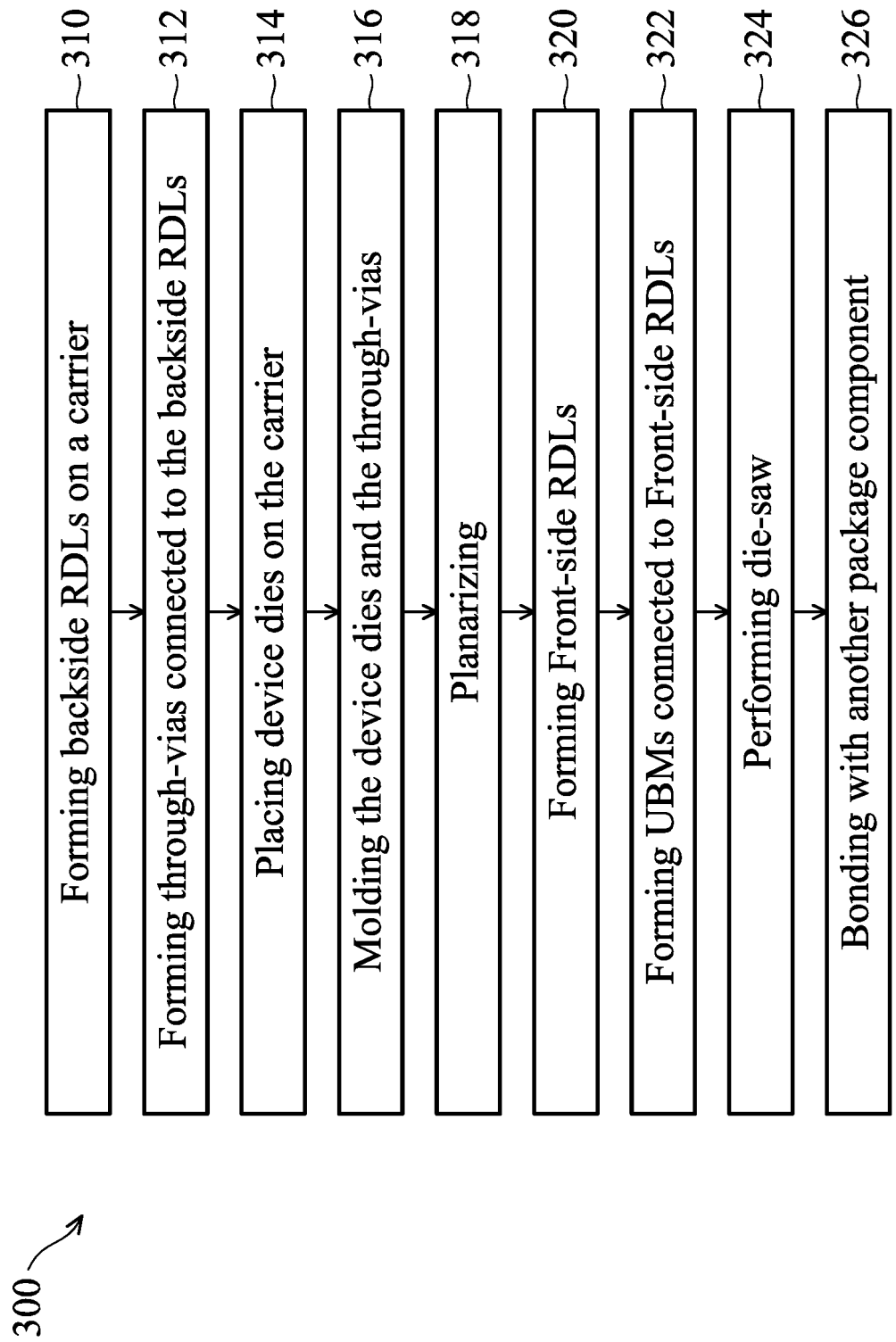
FIG. 30 illustrates a process flow for forming a package in accordance with some embodiments.

FIGS. 1 through 17 illustrate the cross-sectional views of intermediate stages in the formation a package in accordance with some embodiments. The steps shown in FIG. 1 through 17 are also illustrated schematically in the process flow 300 shown in FIG. 30. In the subsequent discussion, the process steps shown in FIGS. 1 through 17 are discussed referring to the process steps in FIG. 30.

FIG. 1 illustrates carrier 20 and release layer 22 disposed on carrier 20. Carrier 20 may be a glass carrier, a ceramic carrier, or the like. Carrier 20 may have a round top-view shape and may have a size of a silicon wafer. For example, carrier 20 may have an 8-inch diameter, a 12 inch diameter, or the like. Release layer 22 may be formed of a polymer-based material (such as a Light To Heat Conversion (LTHC) material), which may be removed along with carrier 20 from the overlying structures that will be formed in subsequent steps. In some embodiments, release layer 22 is formed of an epoxy-based thermal-release material. In other embodiments, release layer 22 is formed of an ultra-violet (UV) glue. Release layer 22 may be dispensed as a liquid and cured. In alternative embodiments, release layer 22 is a laminate film and is laminated onto carrier 20. The top surface of release layer 22 is leveled and has a high degree of co-planarity.

Dielectric layer 24 is formed on release layer 22. In accordance with some embodiments of the present disclosure, dielectric layer 24 is formed of a polymer, which may also be a photo-sensitive material such as polybenzoxazole (PBO), polyimide, or the like, that may be easily patterned using a photo lithography process. In alternative embodiments, dielectric layer 24 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
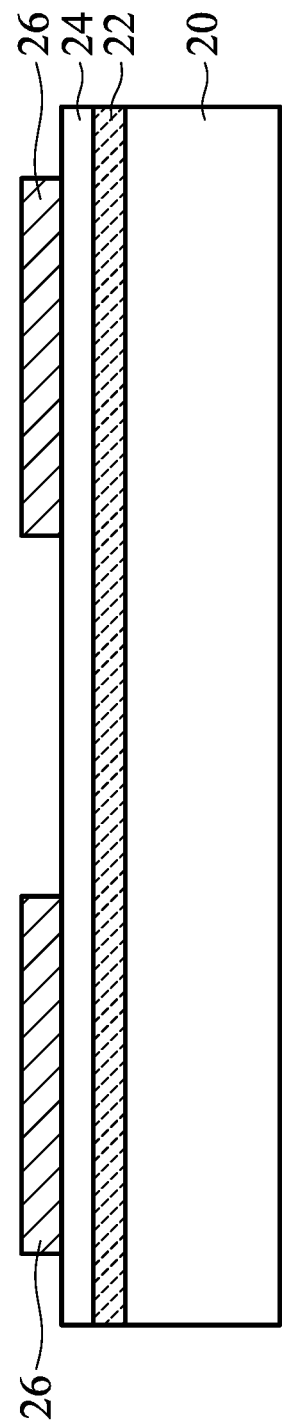
Figure 8:
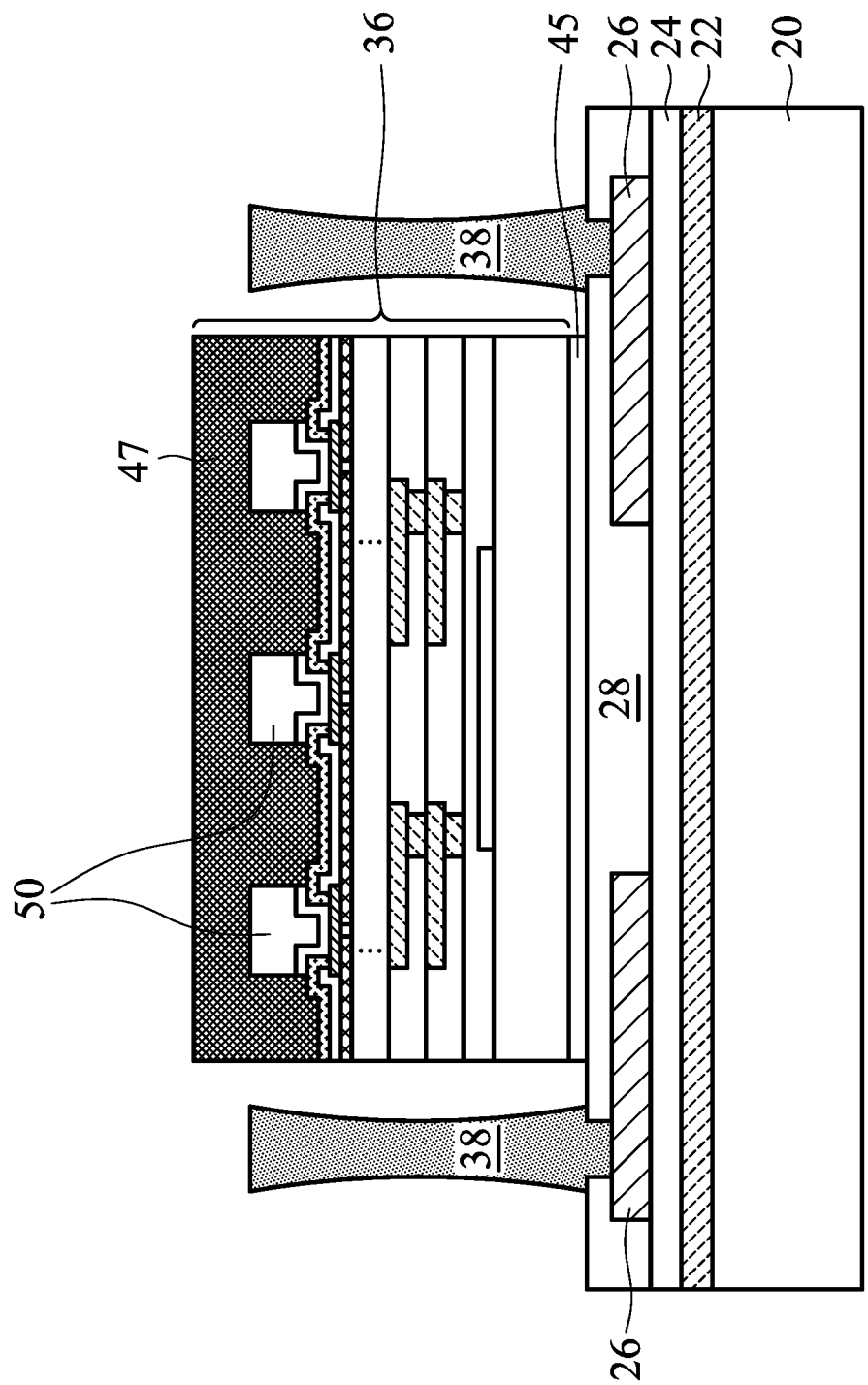

Referring to FIG. 2, Redistribution Lines (RDLs) 26 are formed over dielectric layer 24. The respective step is shown as step 310 in the process flow shown in FIG. 30. RDLs 26 are also referred to as backside RDLs since they are located on the backside of device die 36 (FIG. 8). The formation of RDLs 26 may include forming a seed layer (not shown) over dielectric layer 24, forming a patterned mask (not shown) such as a photo resist over the seed layer, and then performing a metal plating on the exposed seed layer. The patterned mask is then removed, followed by the removal of the seed layer previously covered by the removed patterned mask, leaving RDLs 26 as in FIG. 2. In accordance with some embodiments, the seed layer comprises a titanium layer and a copper layer over the titanium layer. The seed layer may be formed using, for example, Physical Vapor Deposition (PVD). The plating may be performed using, for example, electroless plating.

Figure 3:
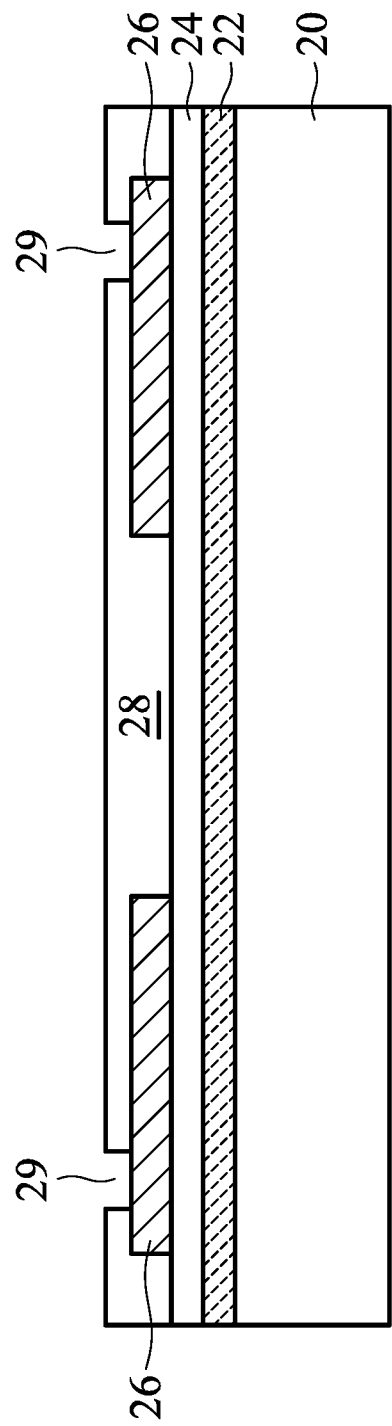

Referring to FIG. 3, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive polymer such as PBO, polyimide, or the like. In alternative embodiments, dielectric layer 28 is formed of a nitride such as silicon nitride, an oxide such as silicon oxide, PSG, BSG, BPSG, or the like. Dielectric layer 28 is then patterned to form openings 29 therein. Hence, RDLs 26 are exposed through the openings 29 in dielectric layer 28.

Figure 4:
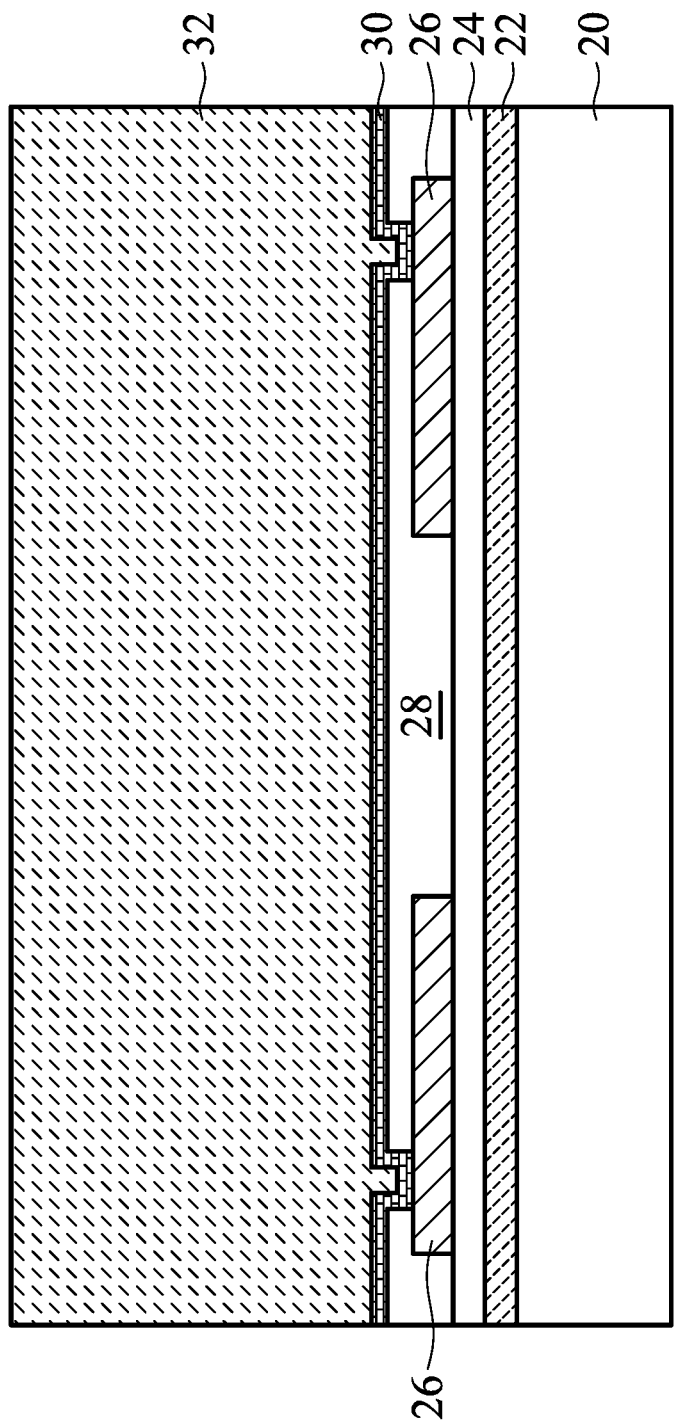

FIGS. 4 through 7 illustrate the formation of metal posts 38. Throughout the description, metal posts 38 are alternatively referred to as through-vias 38 since metal posts 38 penetrate through the subsequently formed molding material. The respective step is shown as step 312 in the process flow shown in FIG. 30. Referring to FIG. 4, metal seed layer 30 is formed, for example, through Physical Vapor Deposition (PVD). Metal seed layer 30 may include copper, and may include a titanium layer and a copper layer over the titanium layer in accordance with some embodiments. Photo resist 32 is formed over metal seed layer 30. In accordance with some embodiments, photo resist 32 is a dry film, which is laminated onto metal seed layer 30. In alternative embodiments, photo resist 32 is formed by spin coating.

Figure 5:
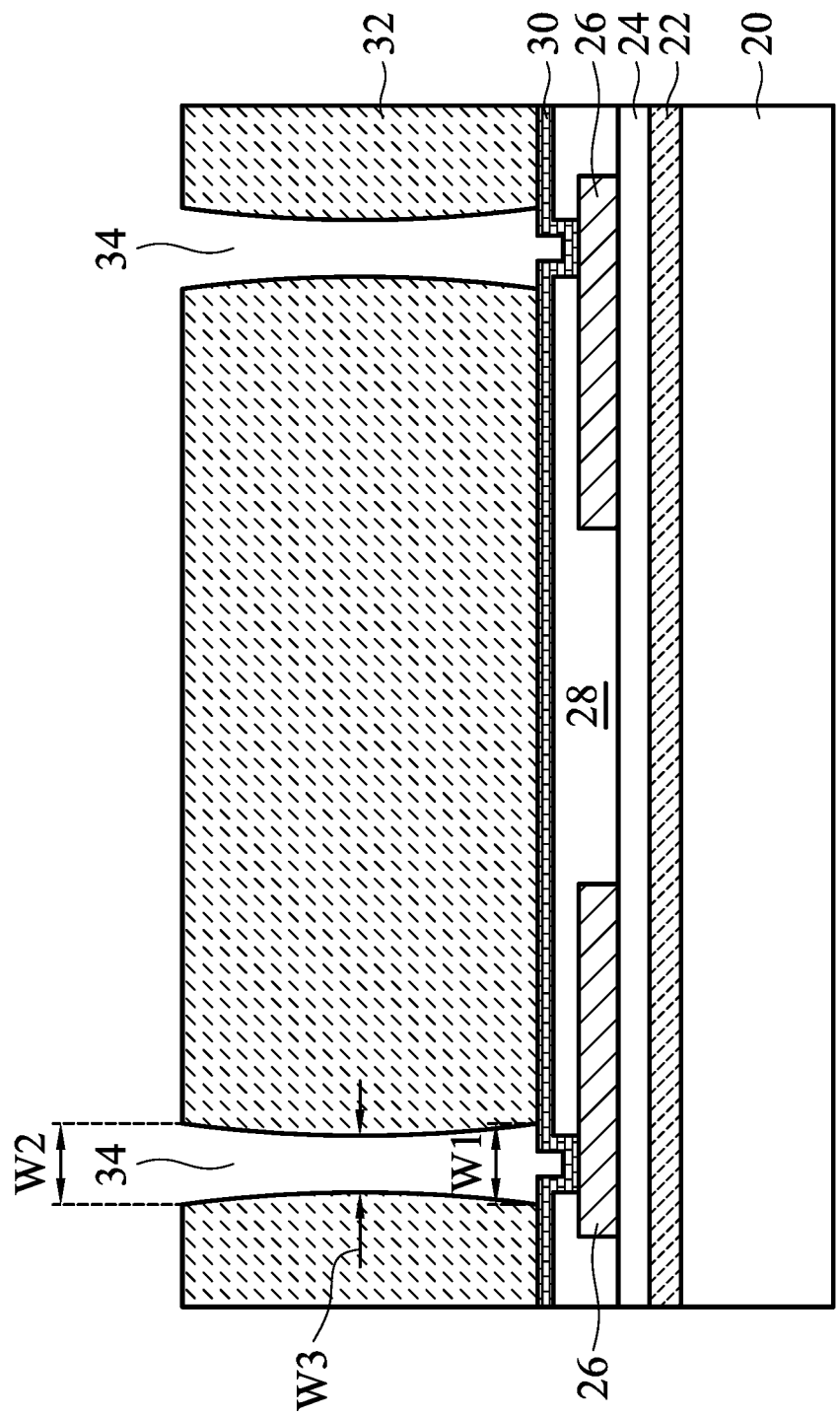

A light-exposure is then performed on photo resist 32 using a photo lithography mask (not shown), which includes transparent portions allowing light to pass through and opaque portions for blocking the like. After the development, openings 34 are formed in photo resist 32, as shown in FIG. 5. Metal seed layer 30 is exposed to openings 34. Openings 34 have a sand timer profile, with the bottom width W1 and top width W2 being greater than middle width W3. Furthermore, the smallest widths of openings 34 may be close to the middle heights of openings 34.

The material of photo resist 32 is selected to make the resulting openings 34 to have the sand timer profile. In some exemplary embodiments, the photo resist includes TOK P50 series photo resist (manufactured by Tokyo Ohka Kogyo America Incorporated). The TOK P50 may include polyacrylate, cross-linker, and photo-sensitive initiator in some embodiments. With the proper photo resist material being used, and process conditions for exposing and development being tuned, the sand timer profile may be generated.

Figure 6:
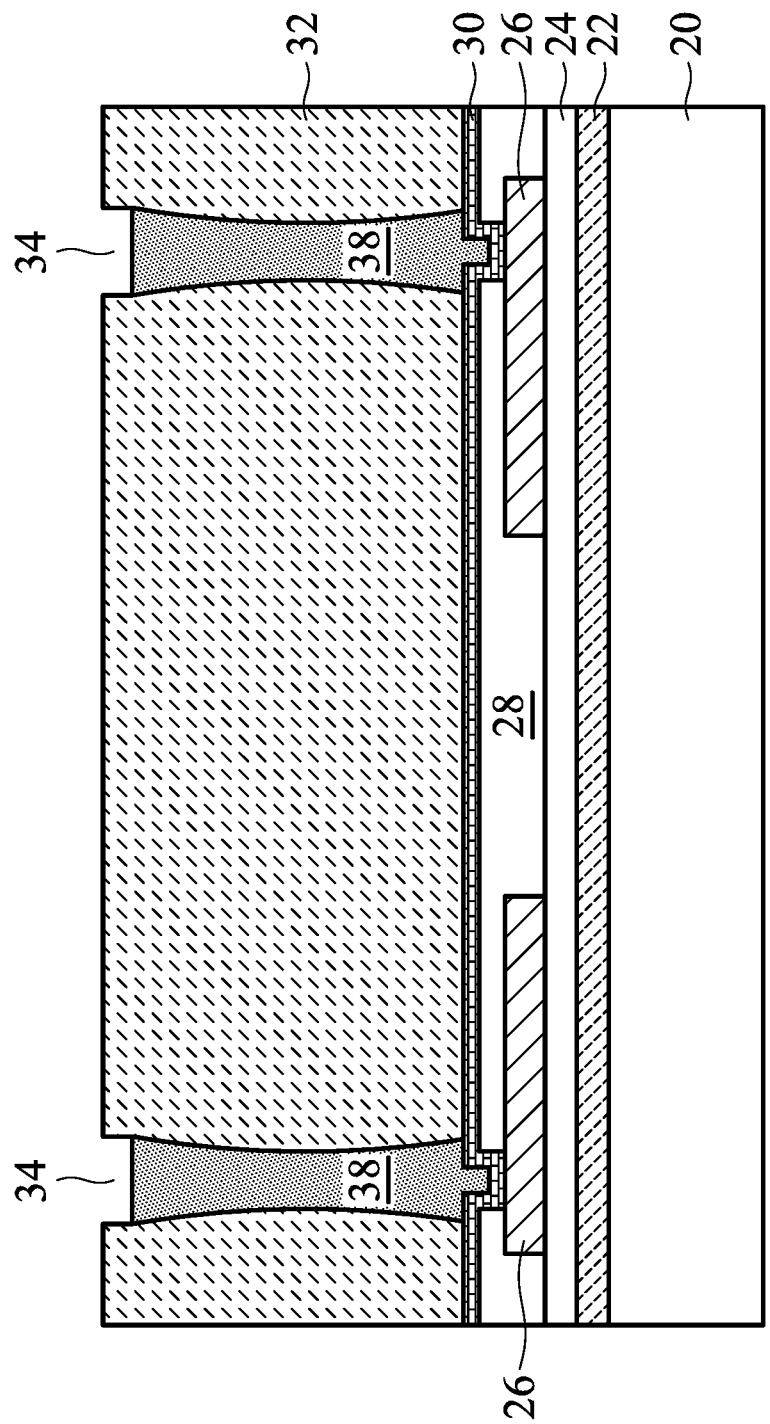
Figure 7:
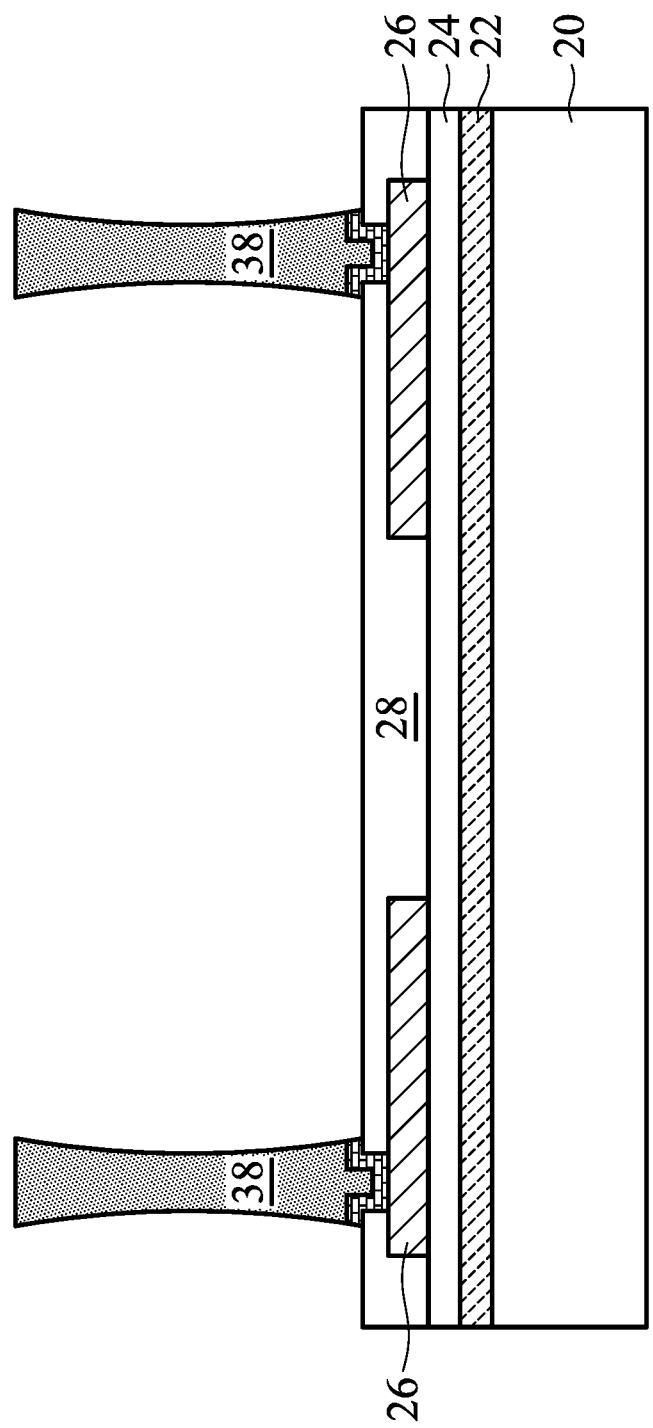

Next, as shown in FIG. 6, through-vias 38 are formed by plating. The plating rate is controlled to ensure that the shape of the plated through-vias 38 follow the shape of openings 34. In subsequent steps, photo resist 32 is removed, and hence the underlying portions of metal seed layer 30 are exposed. The exposed portions of metal seed layer 30 are then removed in an etching step. The resulting through-vias 38 are illustrated in FIG. 7. Throughout the description, the remaining portions of metal seed layer 30 are also referred to as parts of through-vias 38.

Through-vias 38 have the shape of rods, with the middle portions being narrower than the respective top portions and the respective bottom portions. It is noted that FIG. 7 illustrates the shapes of through-vias 38 in one vertical plane. If viewed from any other vertical plane, through-vias 38 may also have the sand timer profile. The top-view shapes of through-vias 38 may be circles, rectangles, squares, hexagons, or the like.

FIG. 8 illustrates the placement of device die 36. The respective step is shown as step 314 in the process flow shown in FIG. 30. It is appreciated that although a single device die 36 is illustrated, a plurality of device dies identical to device die 36 will also be placed over dielectric layer 28 during this step. Device die 36 is adhered to dielectric layer 28 through Die-Attach Film (DAF) 45, which may be an adhesive film. Device die 36 may be a logic device die including logic transistors therein. In some exemplary embodiments, device die 36 is designed for mobile applications and may be a Power Management Integrated Circuit (PMIC) die, a Transceiver (TRX) die, or the like.

In some exemplary embodiments, metal pillars 50 (such as copper posts) are pre-formed as the topmost portions of device die 36, and metal pillars 50 are electrically coupled to the integrated circuit devices such as transistors in device die 36. In accordance with some embodiments of the present disclosure, a polymer fills the gaps between neighboring metal pillars 50 to form top dielectric layer 47. Top dielectric layer 47 may be formed of PBO in accordance with some exemplary embodiments. In accordance with some embodiments, the top surface of top dielectric layer 47 is higher than the top surface of metal pillars 50.

Figure 9:
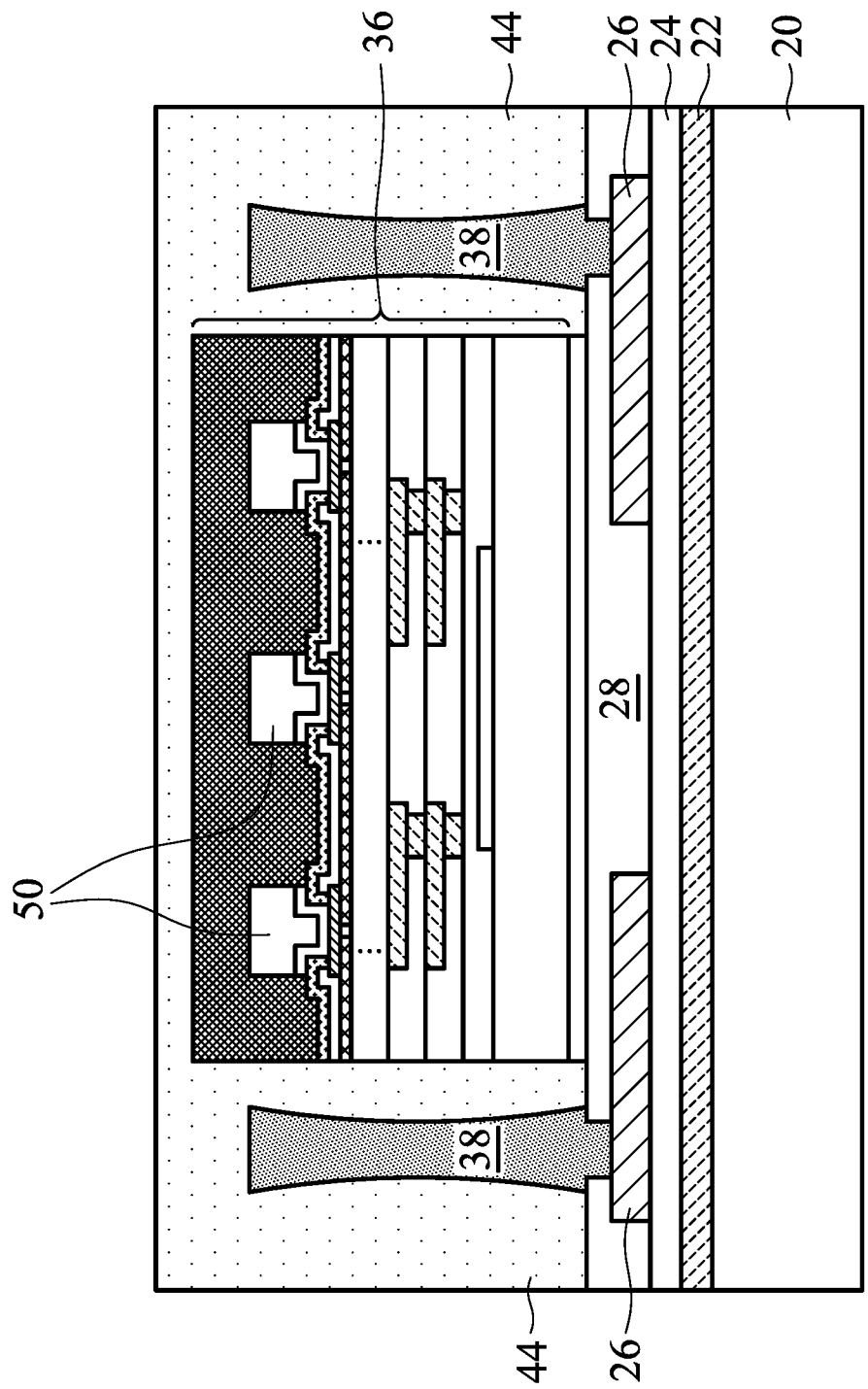

Next, as shown in FIG. 9, molding material 44 is molded on device die 36. The respective step is shown as step 316 in the process flow shown in FIG. 30. Molding material 44 fills the gaps between neighboring through-vias 38 and the gaps between through-vias 38 and device die 36. Molding material 44 may include a molding compound, a molding underfill, an epoxy, or a resin. The top surface of molding material 44 may be higher than the top ends of through-vias 38 and metal pillars 50.

Figure 10:
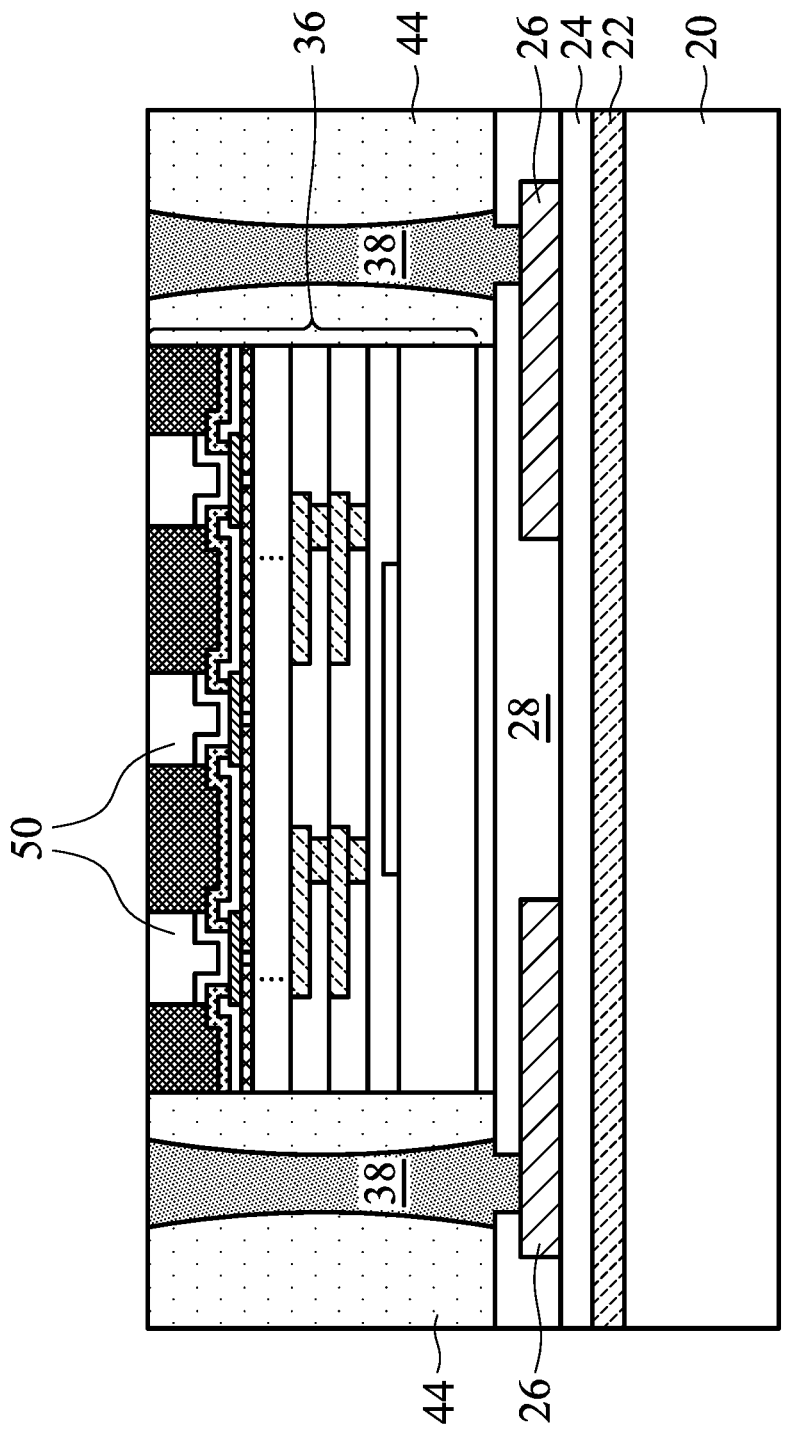

Further referring to FIG. 10, a planarization such as a Chemical Mechanical Polish (CMP) step or a grinding step is performed to thin molding material 44, until through-vias 38 and metal pillars 50 are exposed. The respective step is shown as step 318 in the process flow shown in FIG. 30. Due to the planarization, the top ends of through-vias 38 are substantially level (coplanar) with the top surfaces of metal pillars 50, and are substantially coplanar with the top surface of molding material 44.

Figure 11:
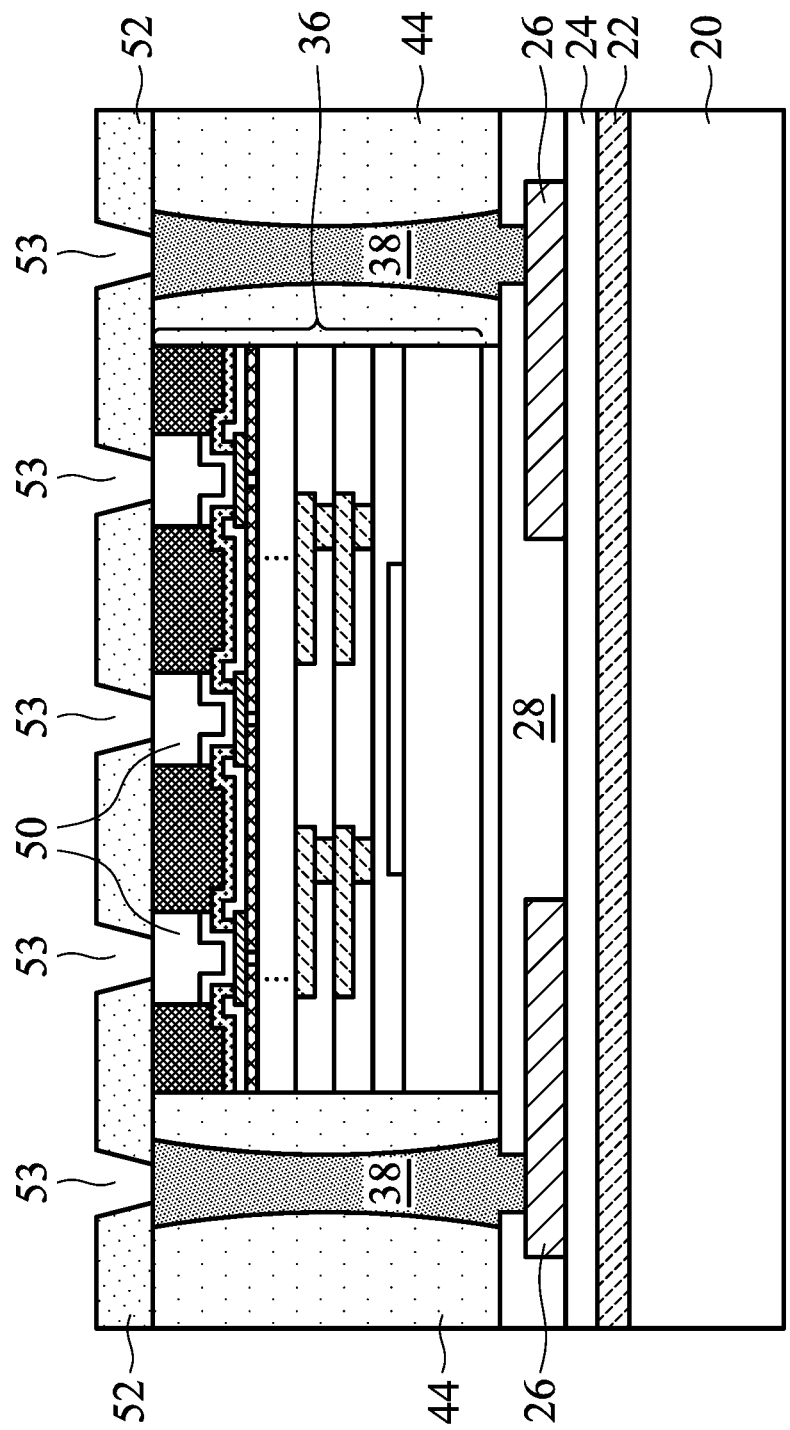

FIGS. 11 through 15 illustrate the formation of front side RDLs. The respective step is shown as step 320 in the process flow shown in FIG. 30. Referring to FIG. 11, dielectric layer 52 is formed. In some embodiments, dielectric layer 52 is formed of a polymer such as PBO, polyimide, or the like. In alternative embodiments, dielectric layer 52 is formed of silicon nitride, silicon oxide, or the like. Openings 53 are formed in dielectric layer 52 to expose through-vias 38 and metal pillars 50. The formation of openings 53 may be performed through a photo lithography process.

Figure 12:
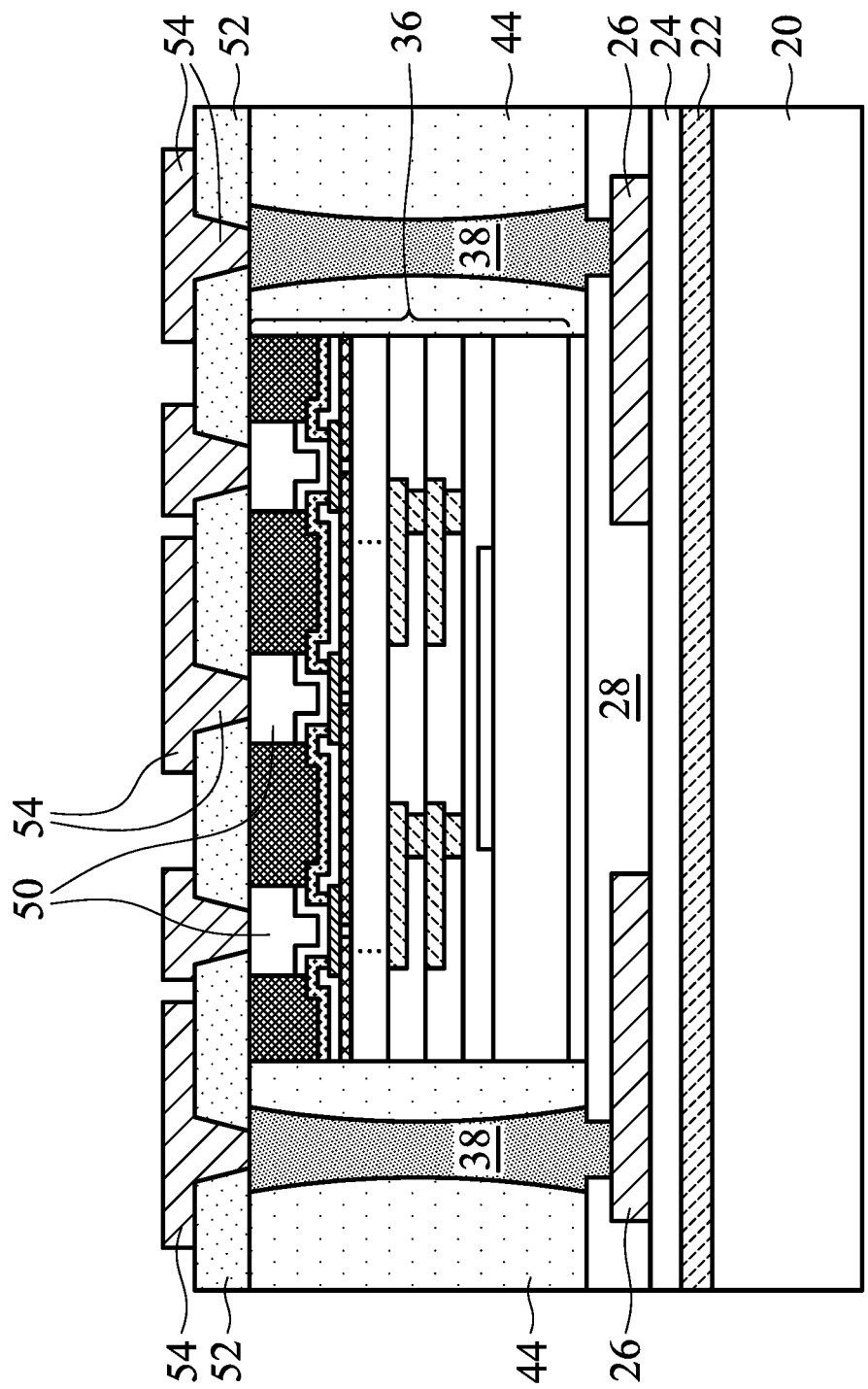

Next, referring to FIG. 12, Redistribution Lines (RDLs) 54 are formed to connect to metal pillars 50 and through-vias 38. RDLs 54 may also interconnect metal pillars 50 and through-vias 38. RDLs 54 include metal traces (metal lines) over dielectric layer 52 as well as vias extending into the openings in dielectric layer 52 to electrically connect to through-vias 38 and metal pillars 50. RDLs 54 are formed in a plating process, wherein each of RDLs 54 includes a seed layer (not shown) and a plated metallic material over the seed layer. The seed layer and the plated material may be formed of the same material or different materials. RDLs 54 may comprise a metal or a metal alloy including aluminum, copper, tungsten, and alloys thereof. RDLs 54 are formed of non-solder materials. The via portions of RDLs 54 may be in physical contact with the top surfaces of metal pillars 50.

Figure 13:
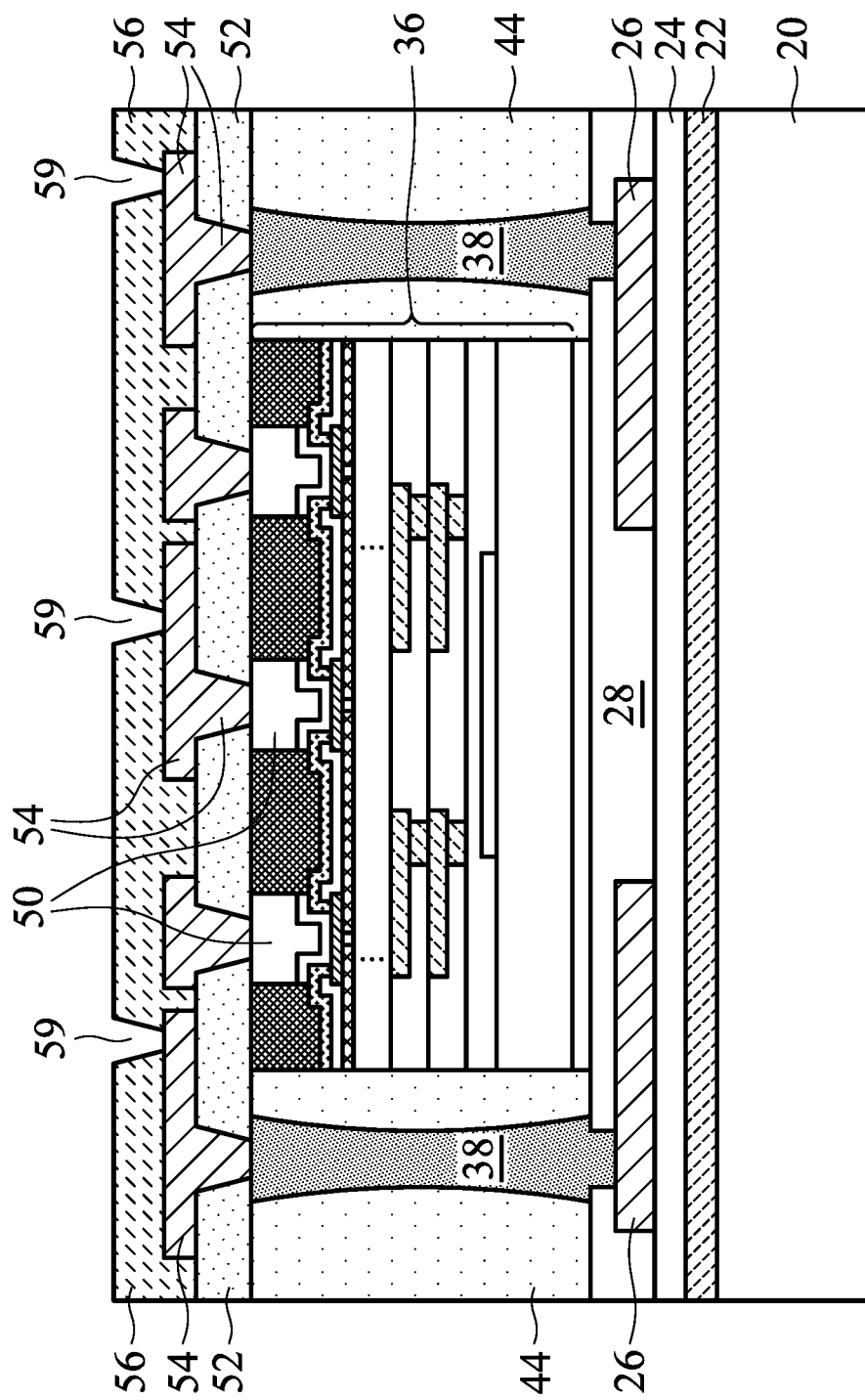

Referring to FIG. 13, dielectric layer 56 is formed over RDLs 54 and dielectric layer 52. Dielectric layer 56 may be formed using a polymer, which may be selected from the same candidate materials as those of dielectric layer 52. For example, dielectric layer 56 may comprise PBO, polyimide, BCB, or the like. Alternatively, dielectric layer 56 may include non-organic dielectric materials such as silicon oxide, silicon nitride, silicon carbide, silicon oxynitride, or the like. Openings 59 are also formed in dielectric layer 56 to expose RDLs 54. The formation of openings 59 may include a photo lithography process.

Figure 14:
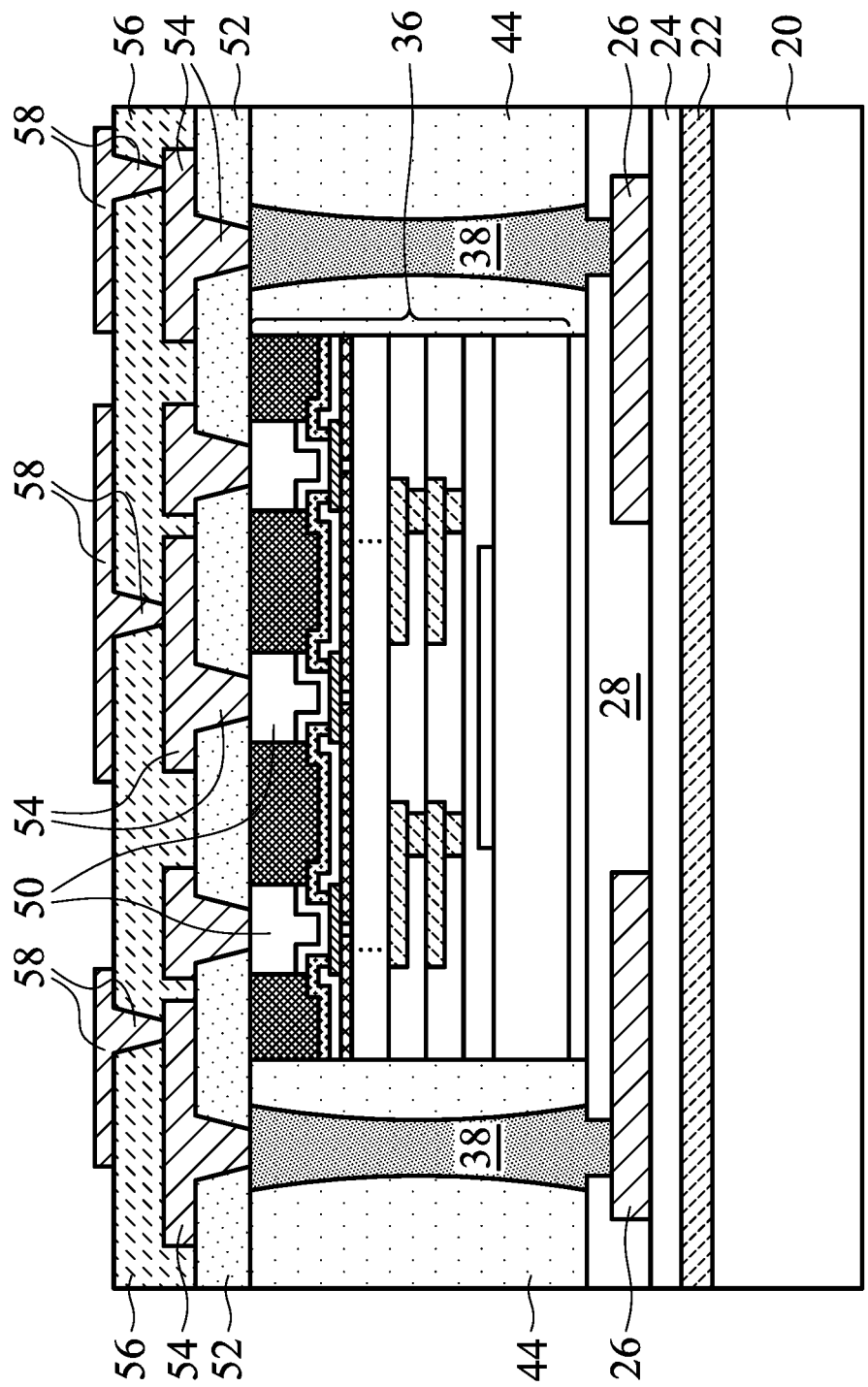

FIG. 14 illustrates the formation of RDLs 58, which are electrically connected to RDLs 54. The formation of RDLs 58 may adopt similar methods and materials to those for forming RDLs 54. RDLs 58 and 54 are also referred to as front-side RDLs since they are located on the front side of device die 36.

Figure 15:
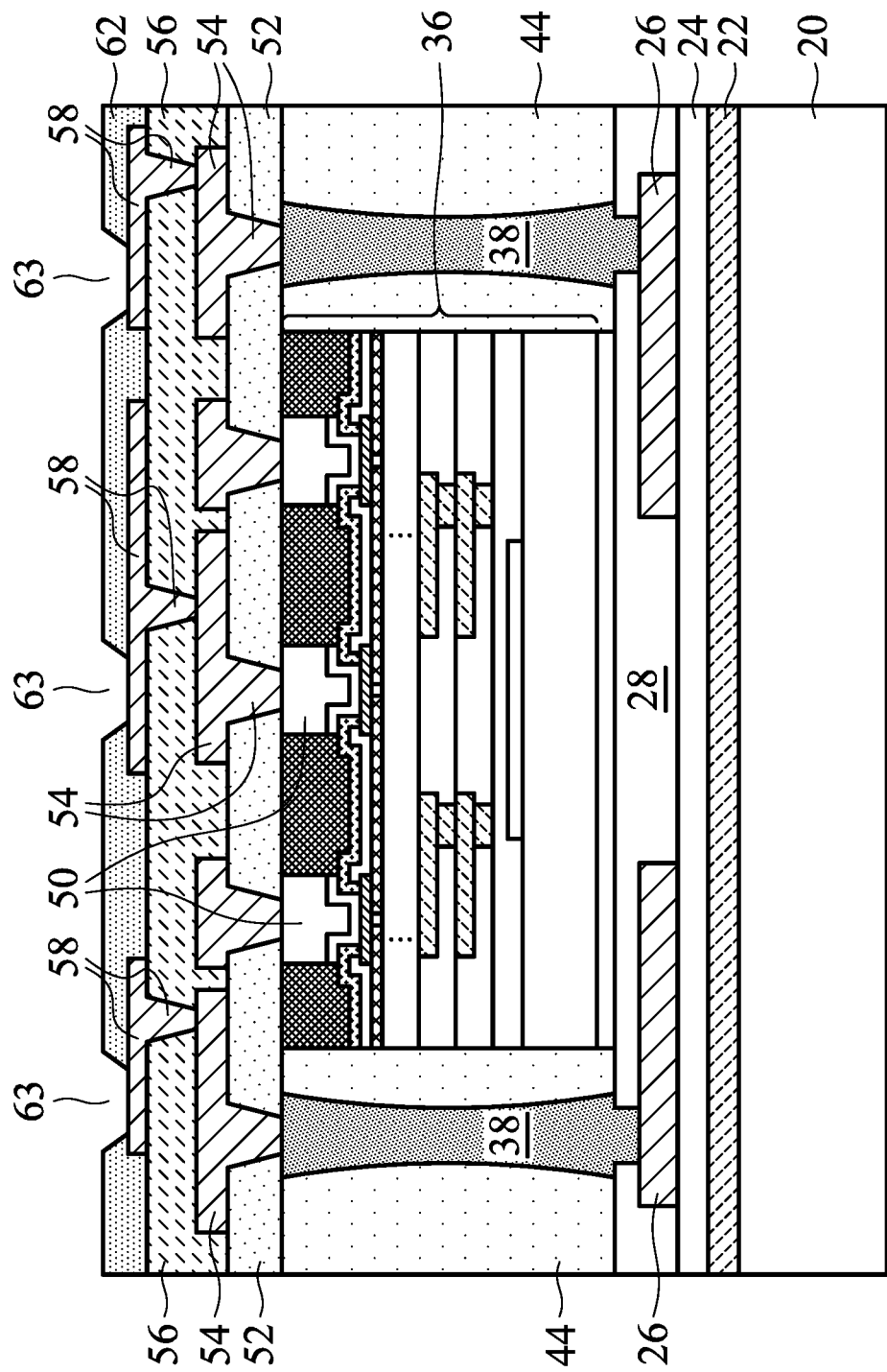

As shown in FIG. 15, an additional dielectric layer 62, which may be a polymer layer, is formed to cover RDLs 58 and dielectric layer 56. Dielectric layer 62 may be selected from the same candidate polymers used for forming dielectric layers 52 and 56. Opening(s) 63 are then formed in dielectric layer 62 to expose the metal pad portions of RDLs 58.

Figure 16:
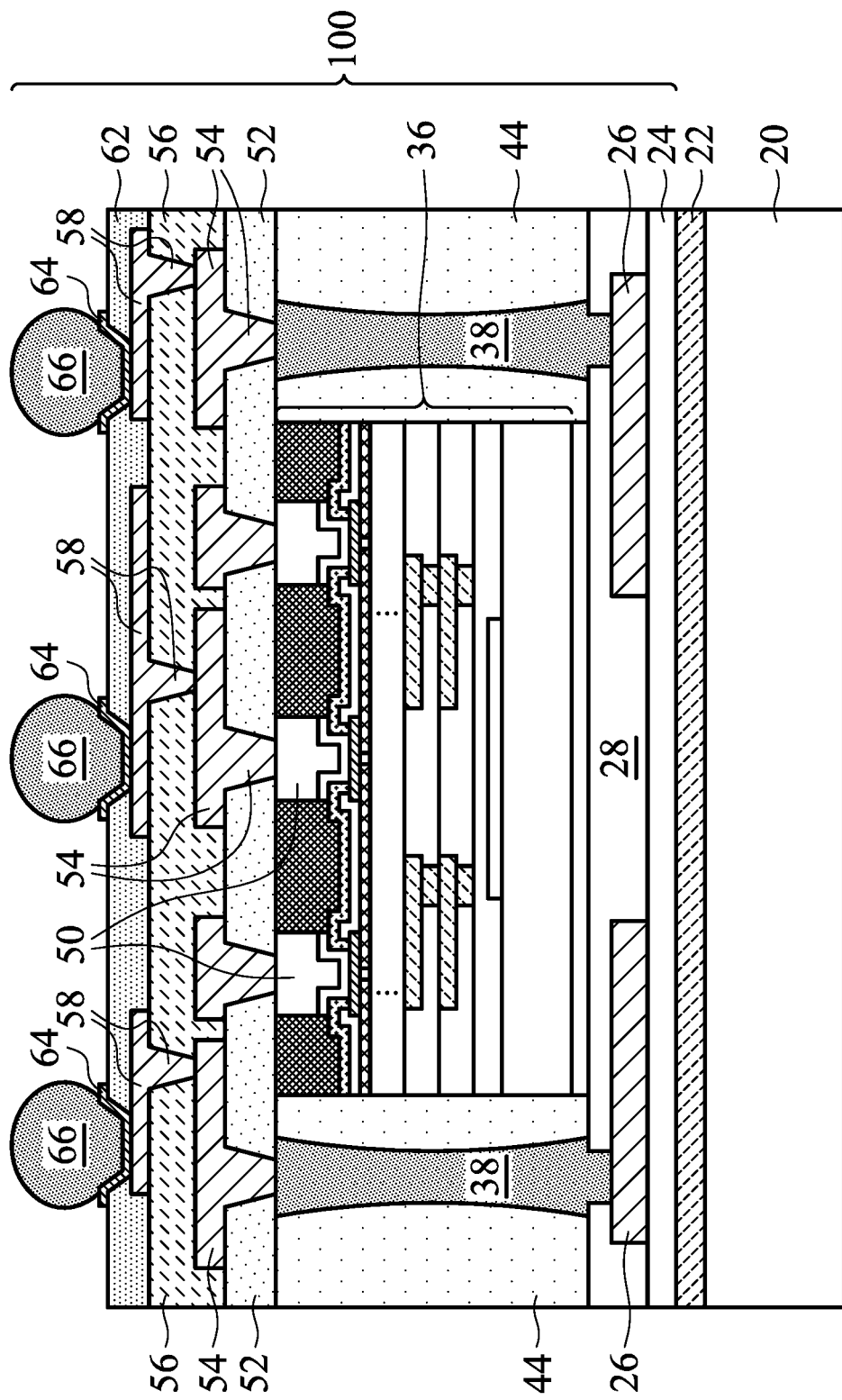

FIG. 16 illustrates the formation of Under-Bump Metallurgies (UBMs) 64 and electrical connectors 66 in accordance with some exemplary embodiments. The respective step is shown as step 322 in the process flow shown in FIG. 30. The formation of UBMs 64 may include deposition and patterning. The formation of electrical connectors 66 may include placing solder balls on the exposed portions of UBMs 64 and then reflowing the solder balls. In alternative embodiments, the formation of electrical connectors 66 includes performing a plating step to form solder regions over RDLs 58 and then reflowing the solder regions. Electrical connectors 66 may also include metal pillars or metal pillars and solder caps, which may also be formed through plating. Throughout the description, the combined structure including device die 36, through-vias 38, molding material 44, and the corresponding RDLs and dielectric layers will be referred to as package 100, which may be a composite wafer with a round top-view shape.

Next, package 100 is de-bonded from carrier 20. In the de-bonding, a tape (not shown) may be adhered onto dielectric layer 62 and electrical connectors 66. In subsequent steps, light such as UV light or laser is projected on release layer 22 to decompose release layer 22, and carrier 20 and release layer 22 are removed from package 100. A die saw step is performed to saw package 100 into a plurality of packages, each including a device die identical to device die 36 and the surrounding through-vias 38. The respective step is shown as step 324 in the process flow shown in FIG. 30. One of the resulting packages is shown as package 102 in FIG. 17.

Figure 17:
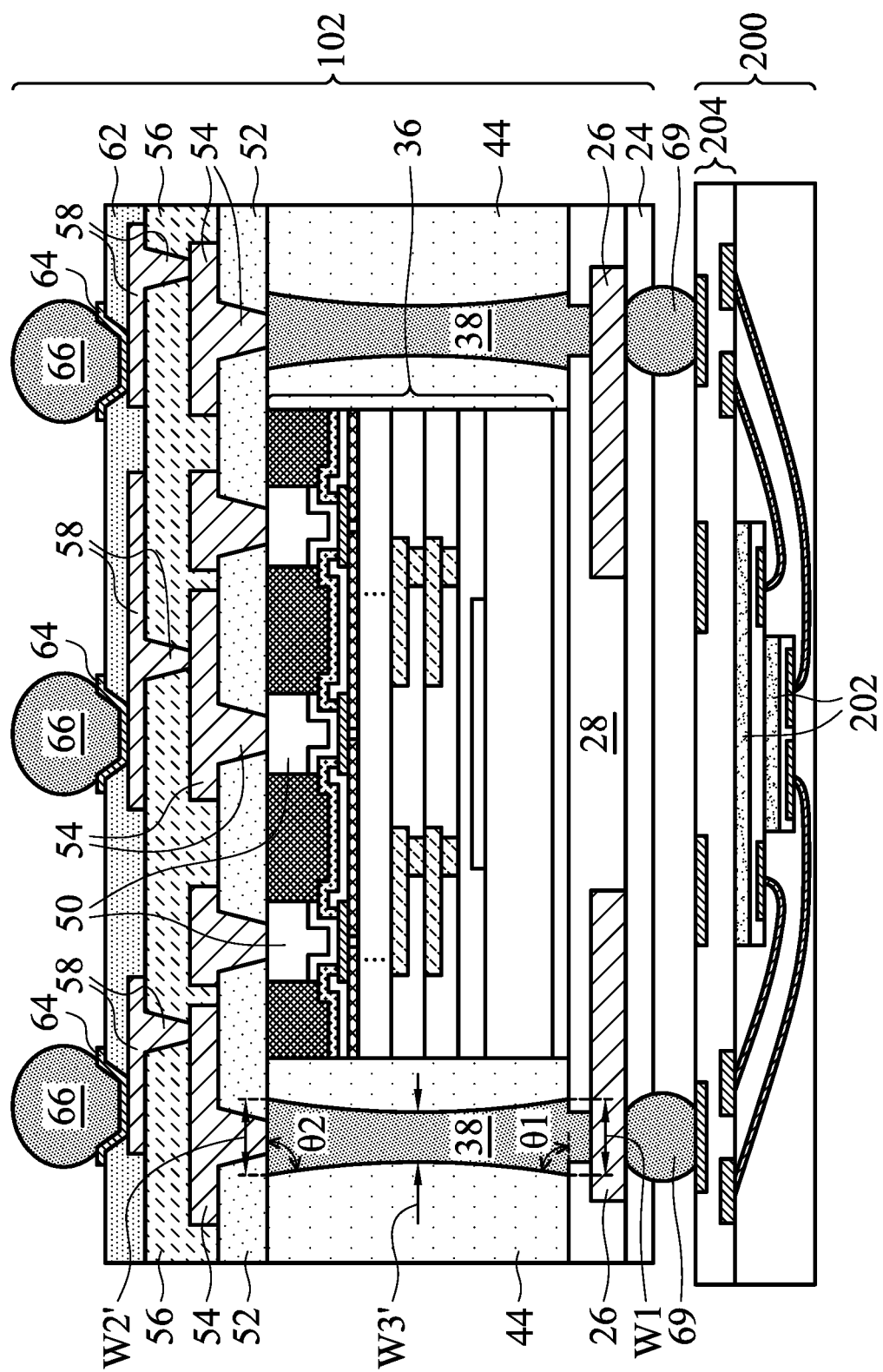

FIG. 17 illustrates the bonding of package 102 with another package 200. The respective step is shown as step 326 in the process flow shown in FIG. 30. In accordance with some embodiments of the present disclosure, the bonding is performed through solder regions 69, which join the metal pad portions of RDLs 26 to the metal pads in package 200. In some embodiments, package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

In the resulting package in FIG. 17, through-via 38 has top width W2', bottom width W1, and smallest width W3' smaller than both top width W2' and bottom width W1. Width W3' may be at or close to the middle height of through-via 38. In accordance with some exemplary embodiments, width difference (W1−W3') is smaller than about 50 μm, and may be greater than about 5 μm. Width difference (W2'−W3') may also be smaller than about 50 μm, and may be greater than about 5 μm. In accordance with some embodiments of the present disclosure, from the top to the bottom of a through-via 38, the widths of the through-via 38 gradually and continuously reduce from top width W2' to smallest width W3', and then gradually and continuously increase from the smallest width W3' to bottom width W1. Bottom tilting angle θ1 and top tilting angle θ2 of the sidewalls of through-vias 38 may be smaller than about 88 degrees in accordance with some embodiments of the present disclosure.

By forming the sand timer profile, the top area of through-via 38 is increased compared to vertical through-vias. As a result, the interface area between through-via 38 and the overlying RDLs 54 and dielectric layer 52 is also increased. The stress applied on the interface is accordingly reduced. The likelihood of the cracking of dielectric layer 52 and the peeling of dielectric layer 52 from the underlying structures is thus reduced.

FIGS. 18 through 21 illustrate cross-sectional views of intermediate stages in the formation of a package in accordance with alternative embodiments. Unless specified otherwise, the materials and the formation methods of the components in these embodiments are essentially the same as the like components, which are denoted by like reference numerals in the embodiments shown in FIGS. 1 through 17. The details regarding the formation process and the materials of the components shown in FIGS. 18 through 21 (and FIGS. 22 through 29) may thus be found in the discussion of the embodiments shown in FIGS. 1 through 17.

Figure 18:
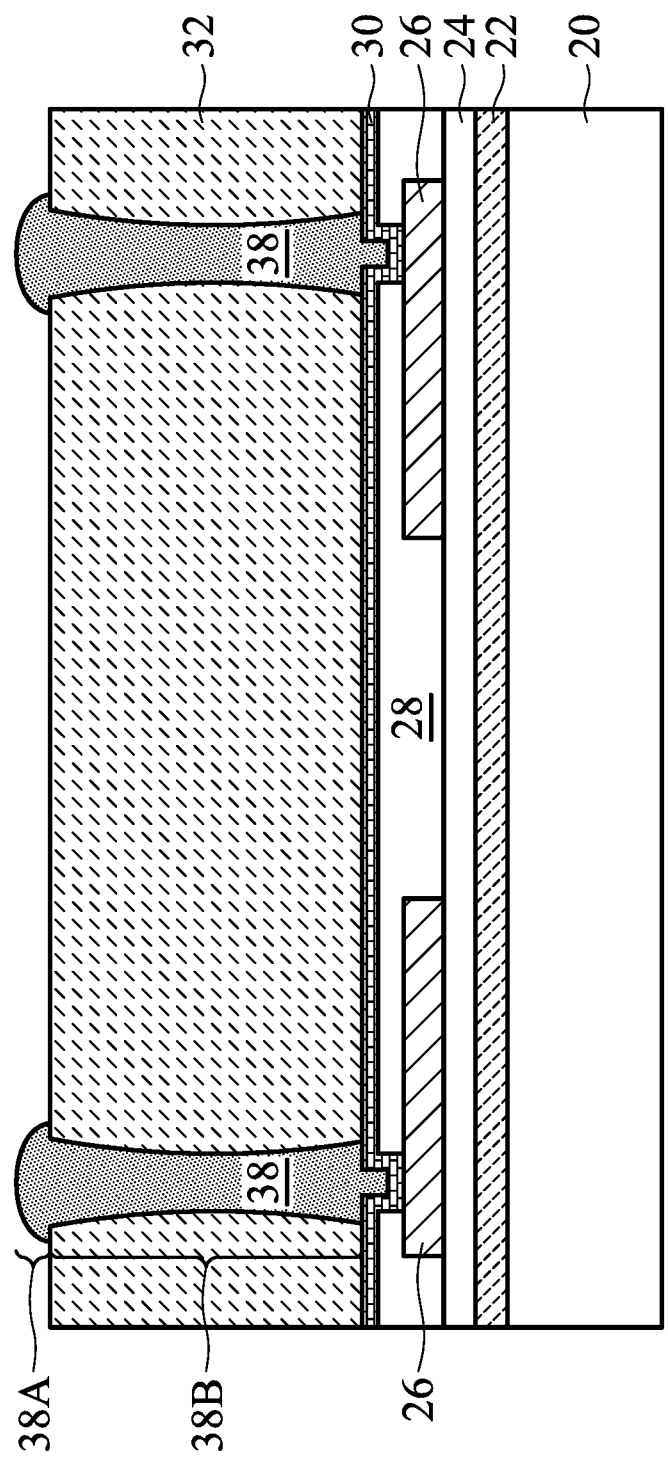
FIGS. 18 through 21 illustrate the cross-sectional views of intermediate stages in the packaging of a device die in accordance with some embodiments, with the respective through-vias having a mushroom shape.

The initial steps of these embodiments are essentially the same as shown in FIGS. 1 through 5. Next, as shown in FIG. 18, through-vias 38 are plated. The plating is continued until the top surfaces of through-vias 38 are level with the top surface of photo resist 32. The plating is further continued with an over-plating process, during which the through-vias 38 are plated over the top surface of photo resist 32. During the over-plating, through-vias 38 grow horizontally to form through-via caps 38A, which are the top portions of through-vias 38. The resulting through-vias 38 thus have a mushroom profile with caps 38A having widths abruptly greater than the underlying body portions 38B of through-vias 38.

Figure 19:
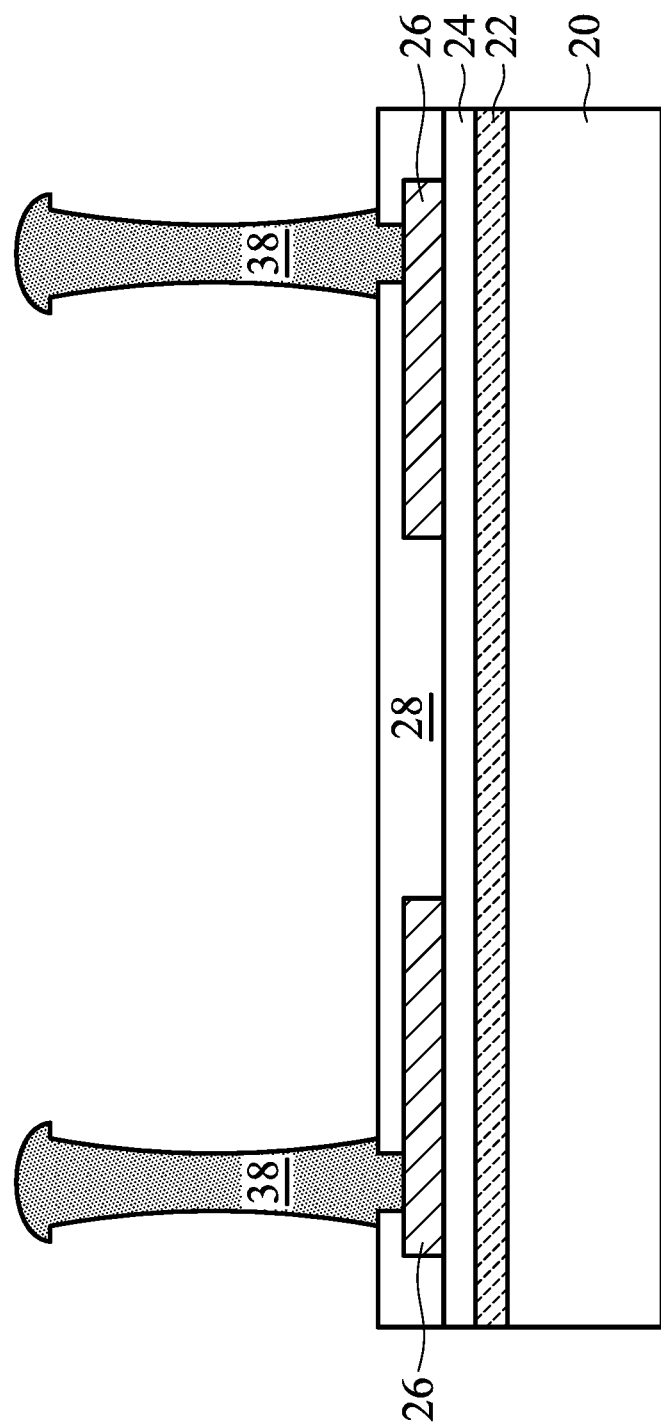
Figure 20:
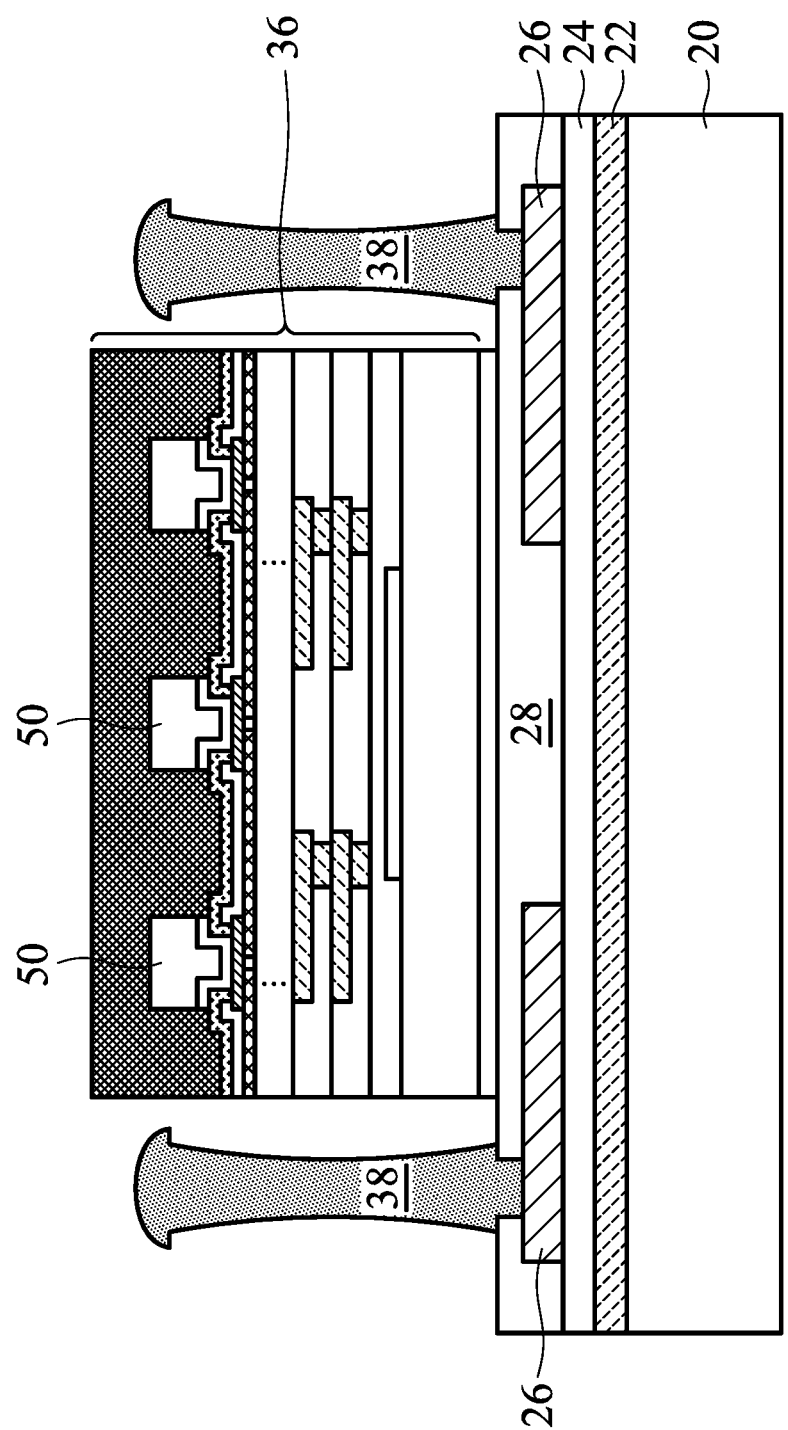
Figure 21:
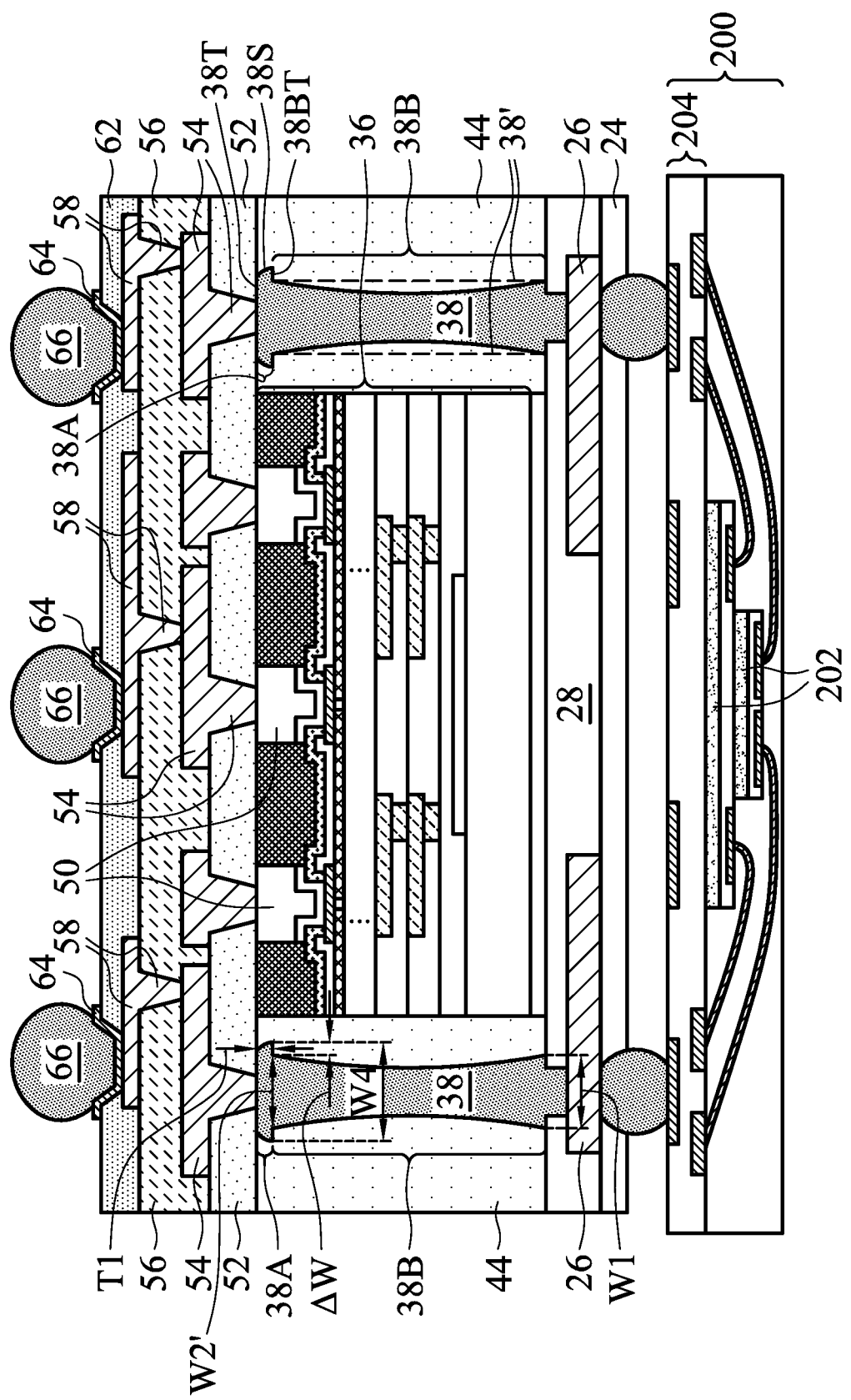

Next, photo resist 32 is removed, and the portions of seed layer 30 covered by photo resist 32 are removed through etching. The resulting structure is shown in FIG. 19. Device die 36 is then placed on dielectric layer 28, as shown in FIG. 20. The subsequent process steps are essentially the same as shown in FIGS. 9 through 17. The resulting structure is shown in FIG. 21.

In the planarization step similar to what is shown in FIG. 10, the top portions of through-via caps 38 are removed, and the bottom portions of through-via caps 38 remain. The resulting through-via caps 38A have flat top surfaces level with the top surfaces of molding material 44 and metal pillars 50. As shown in FIG. 21, through-vias 38 include through-via caps 38A and underlying through-via bodies 38B. In accordance with some embodiments, through-via bodies 38B have the sand timer profile similar to that in FIG. 17. The details of the sand timer profile may be the same as in FIG. 17, and hence are not repeated herein. Through-via bodies 38B may also have other profiles. For example, through-via bodies 38B may have straight sidewalls 38', as illustrated on one of the illustrated through-vias 38 as an example. Straight sidewalls 38' may be vertical or substantially vertical, for example, with the tilting angle being between 89 degrees and about 91 degrees.

Through-via body 38B have top width W2'. Through-via cap 38A have bottom width W4, wherein the transition from width W2' to width W4 may be abrupt or gradual. Width W4 is greater than width W2', and may be greater than all widths of the respective underlying through-via body 38B. In accordance with some embodiments, width W4 is in the range between about 40 μm and about 140 μm. Width difference (W4−W2') may be smaller than about 50 μm, and may also be greater than about 5 μm in accordance with some embodiments. In some embodiments, width difference (W4−W2') is in the range between about 10 μm and about 30 μm. Thickness T1 of through-via caps 38A may be in the range between about 5 μm and about 10 μm.

In accordance with some embodiments of the present disclosure, through-via caps 38A have planar top surfaces 38T, planar bottom surfaces 38BT, and curved sidewalls 38S connecting the planar top surface 38T to the planar bottom surface 38BT.

Advantageously, with the formation of through-via caps 38A, the top areas of through-vias 38 are increased. As a result, the overlay window is increased, wherein if misalignment occurs in the formation of RDLs 54, the via portions of RDLs 54 may still land on through-vias 38. These embodiments may be used in fine-pitch through-vias, in which through-vias 38 are thin, and hence the via portions of RDLs 54 are more likely to be misaligned from through-vias 38. A further advantageous feature of these embodiments is that the interface area between through-vias 38 and the overlying RDLs 54 and dielectric layer 52 is also increased, which results in the reduction in the stress and the likelihood of delamination between through-vias 38 and the overlying RDLs and dielectric layer.

Figure 22:
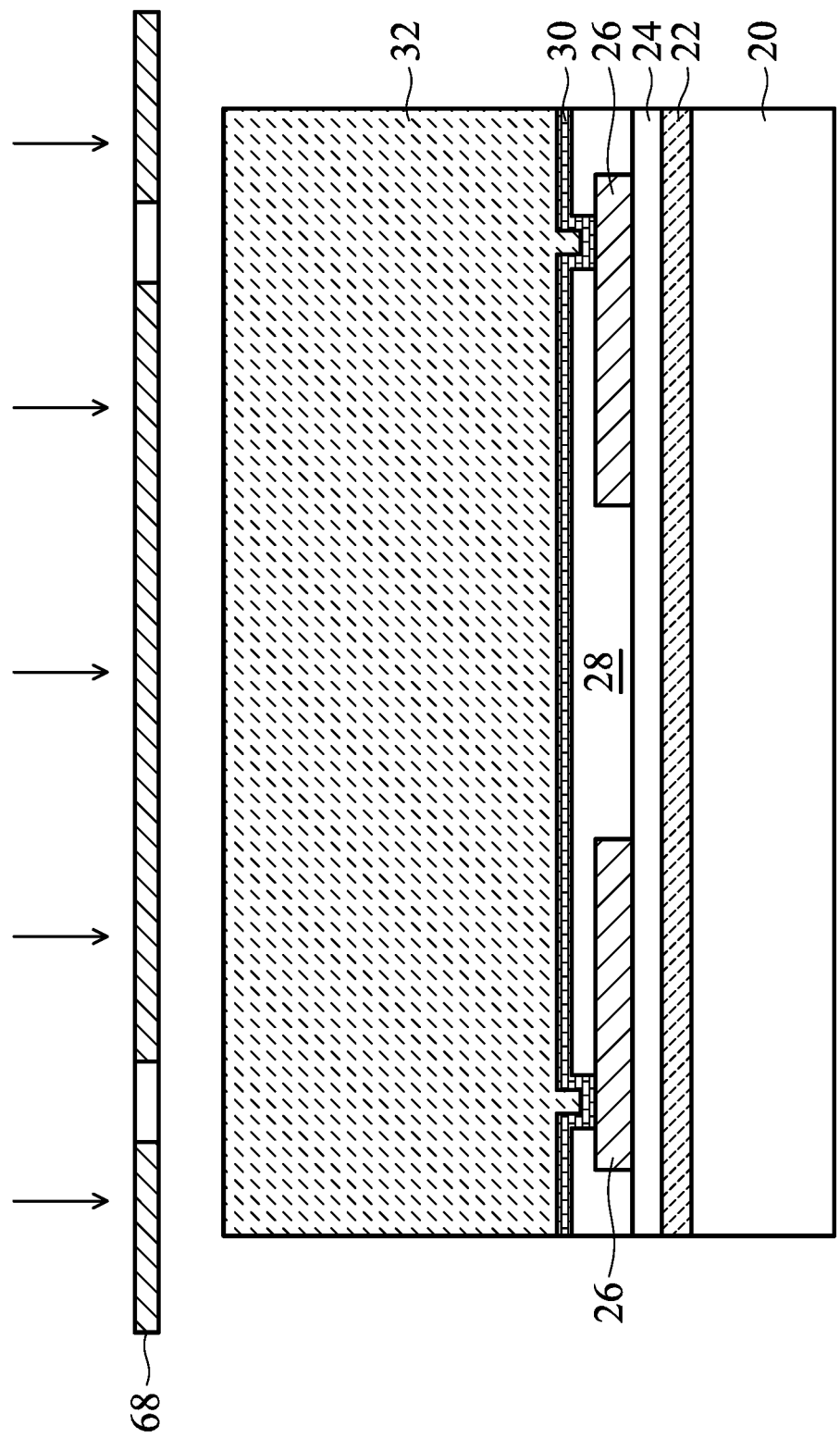
FIGS. 22 through 29 illustrate the cross-sectional views of intermediate stages in the packaging of a device die in accordance with some embodiments, with the respective through-vias having tapered upper parts.
Figure 23:
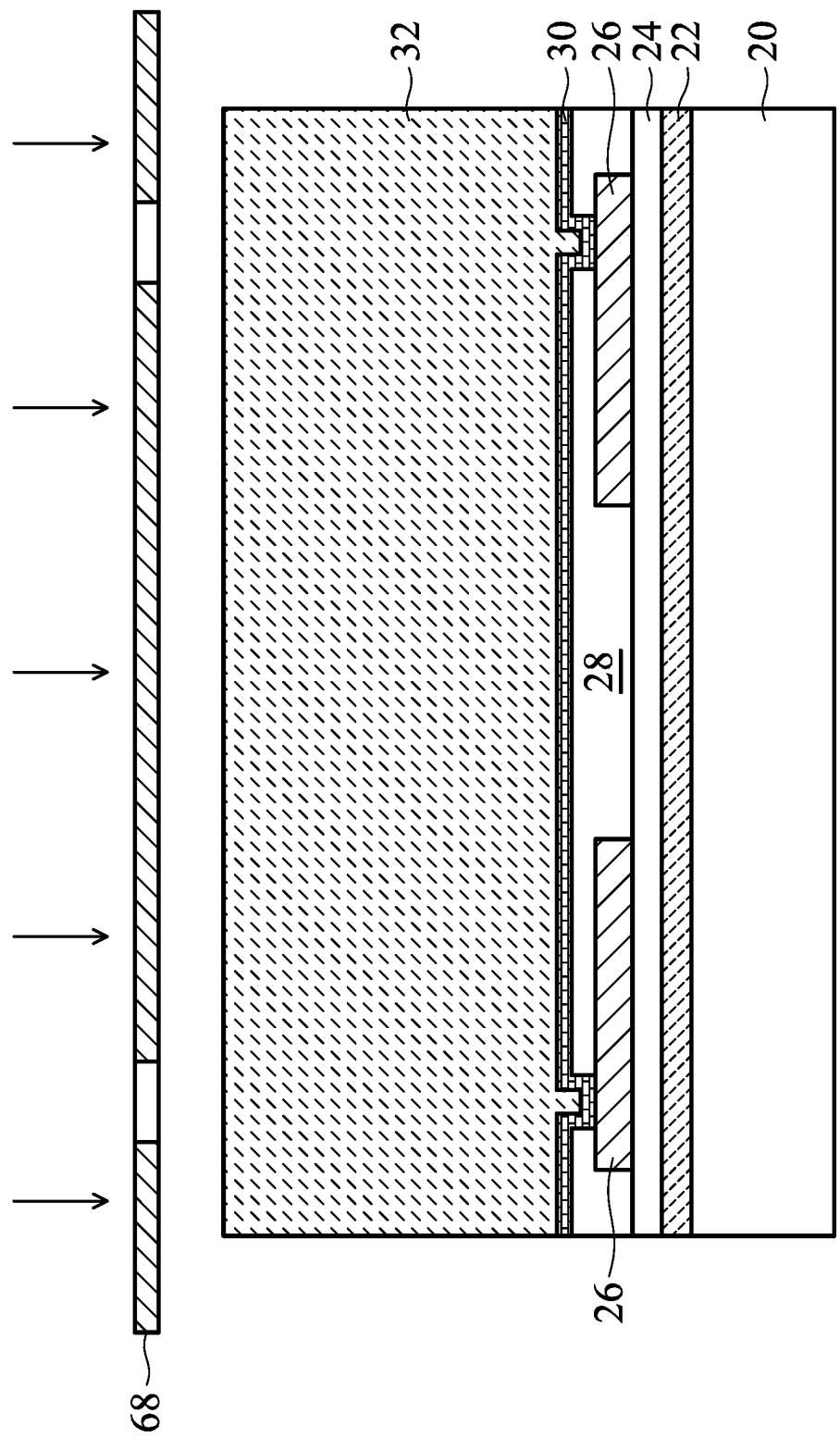

FIGS. 22 through 29 illustrate the formation of a package in accordance with yet alternative embodiments. The initial steps of these embodiments are shown in FIGS. 1 through 4. Next, as shown in FIGS. 22 and 23, a deeper-focus exposure and a shallower-focus exposure are performed. The focus of the deeper-focus exposure is deeper into photo resist 32 than the focus of the shallower-focus exposure. In accordance with some embodiments of the present disclosure, the focus of the deeper-focus exposure is at the depth D1 (from the top surface of photo resist 32, not shown). The focus of the shallower-focus exposure is at the depth D2 greater than D1. In some embodiments, the first exposure (FIG. 22) is the deeper-focus exposure, with lithography mask 68 used, and the second exposure (FIG. 23) is the shallower-focus exposure. In alternative embodiments, the first exposure (FIG. 22) is the shallower-focus exposure, with lithography mask 68 used, and the second exposure (FIG. 23) is the deeper-focus exposure.

Figure 24:
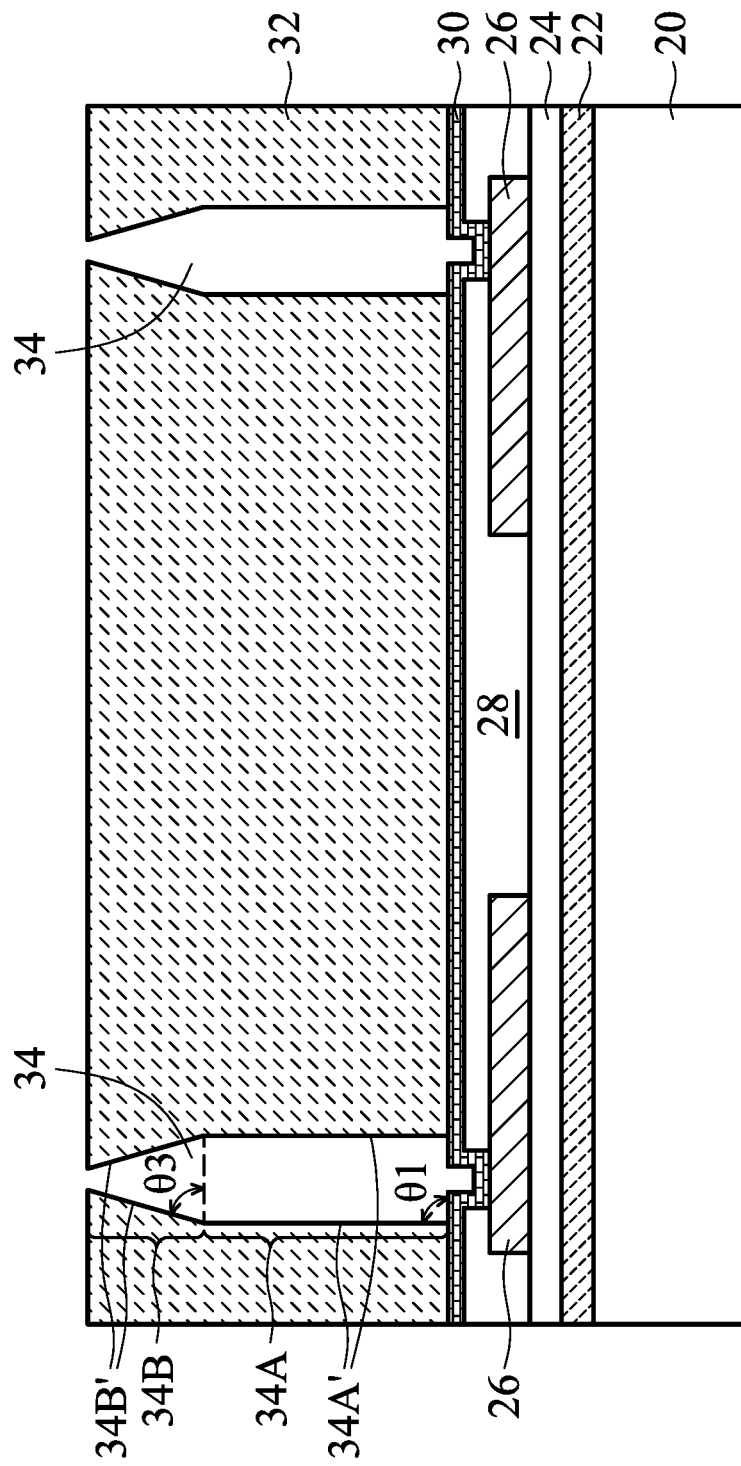

After the deeper-focus exposure and the shallower-focus exposure, photo resist 32 is developed to form openings 34, as shown in FIG. 24. The resulting opening 34 may have a lower portion 34A having substantially straight sidewalls 34A' and upper portion 34B having substantially straight sidewalls 34B', wherein sidewalls 34A' and the respective overlying sidewalls 34B' have a distinguishable joint, at which there is a distinguishable reduction in the tilting angle of sidewalls. The tilting angles of sidewalls 34A' is θ1, and the tilting angles of sidewalls 34B' is θ3, which is smaller than tilting angle θ1. The difference (θ1−θ3) may be greater than about 2 degrees. The tilting angle θ3 of sidewalls 34B' may be in the range between about 85 and about 90 degrees in accordance with some embodiments, while tilting angle θ1 of sidewalls 34A' may be between about 89 degrees and about 91 degrees in some embodiments.

Figure 25:
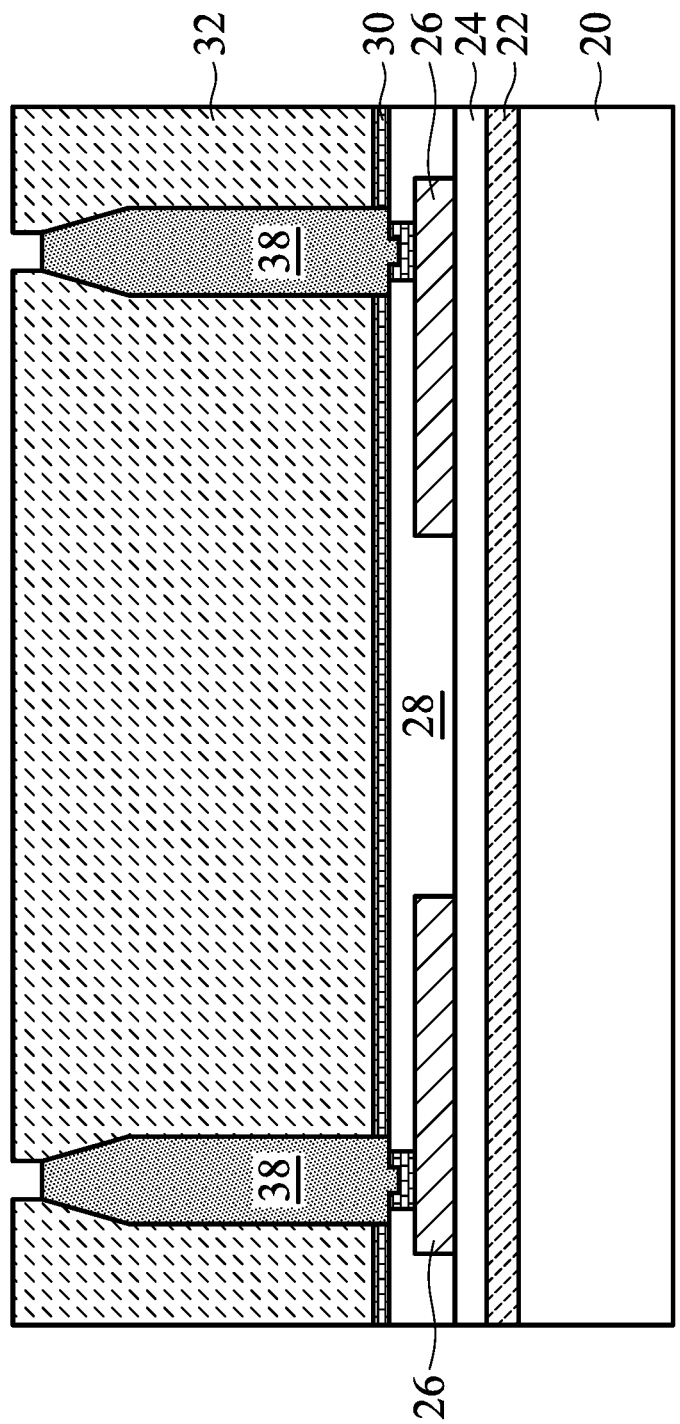
Figure 26:
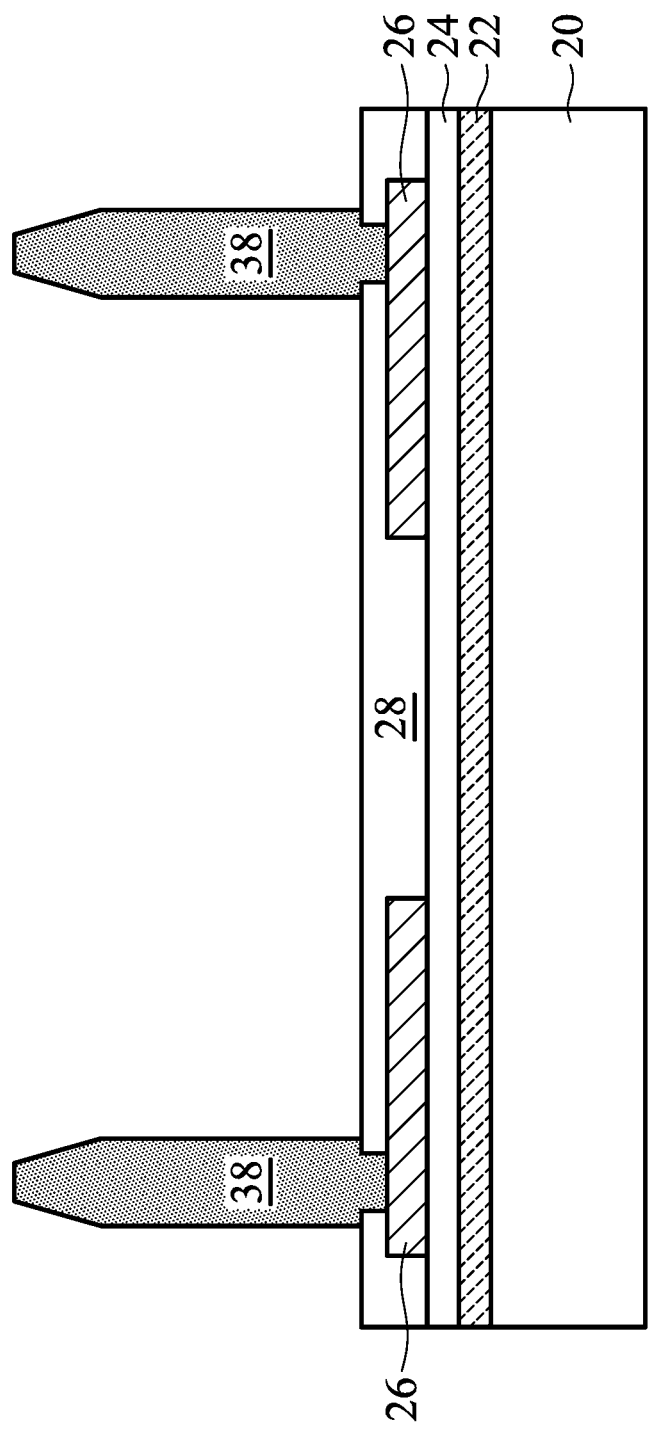
Figure 27:
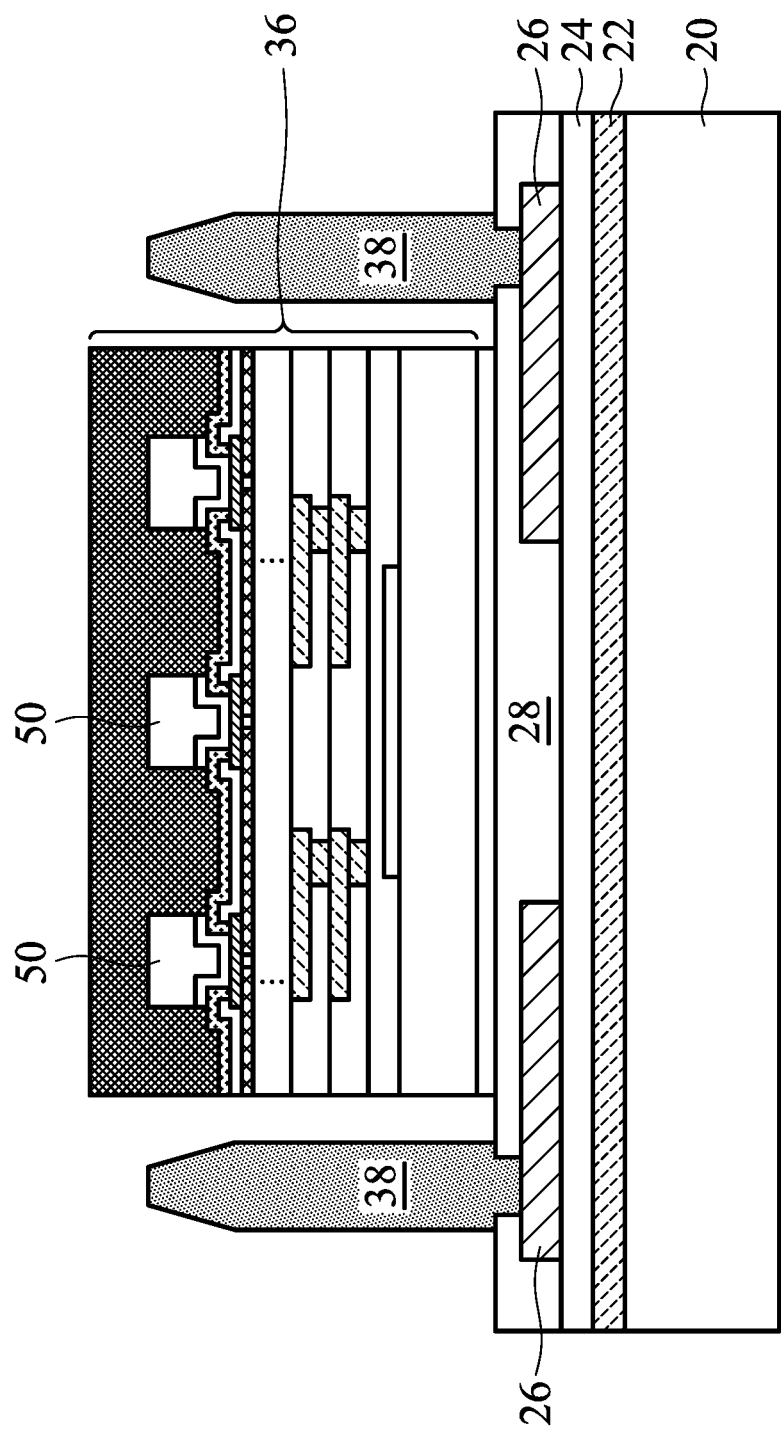
Figure 28:
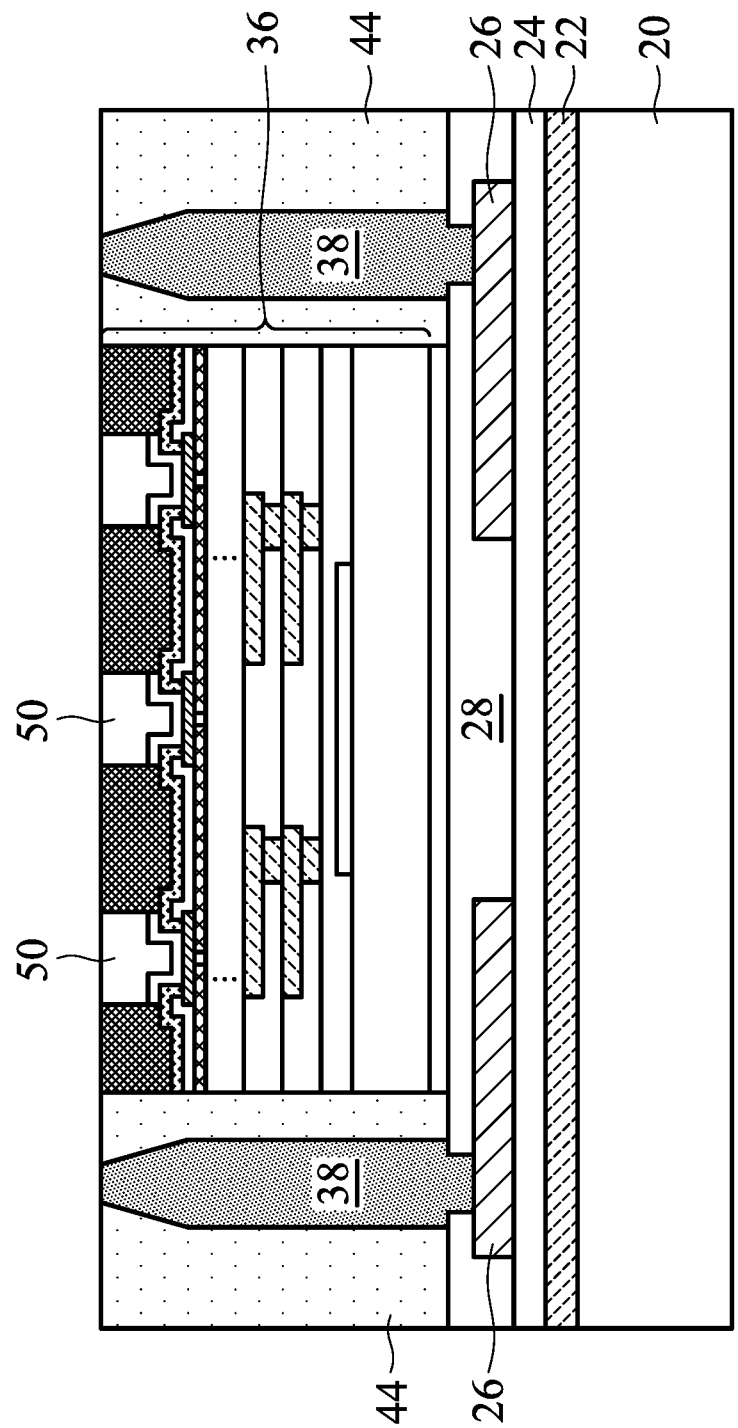

Next, as shown in FIG. 25, through-vias 38 are formed by plating. Photo resist 32 is then removed, and the portions of seed layer 30 covered by photo resist 32 are removed through etching. The resulting structure is shown in FIG. 26. Device die 36 is then placed on dielectric layer 28, as shown in FIG. 27. Molding material 44 is then applied, and a planarization is performed, as shown in FIG. 28. The subsequent process steps are essentially the same as shown in FIGS. 11 through 17. The resulting structure is shown in FIG. 29.

Figure 29:
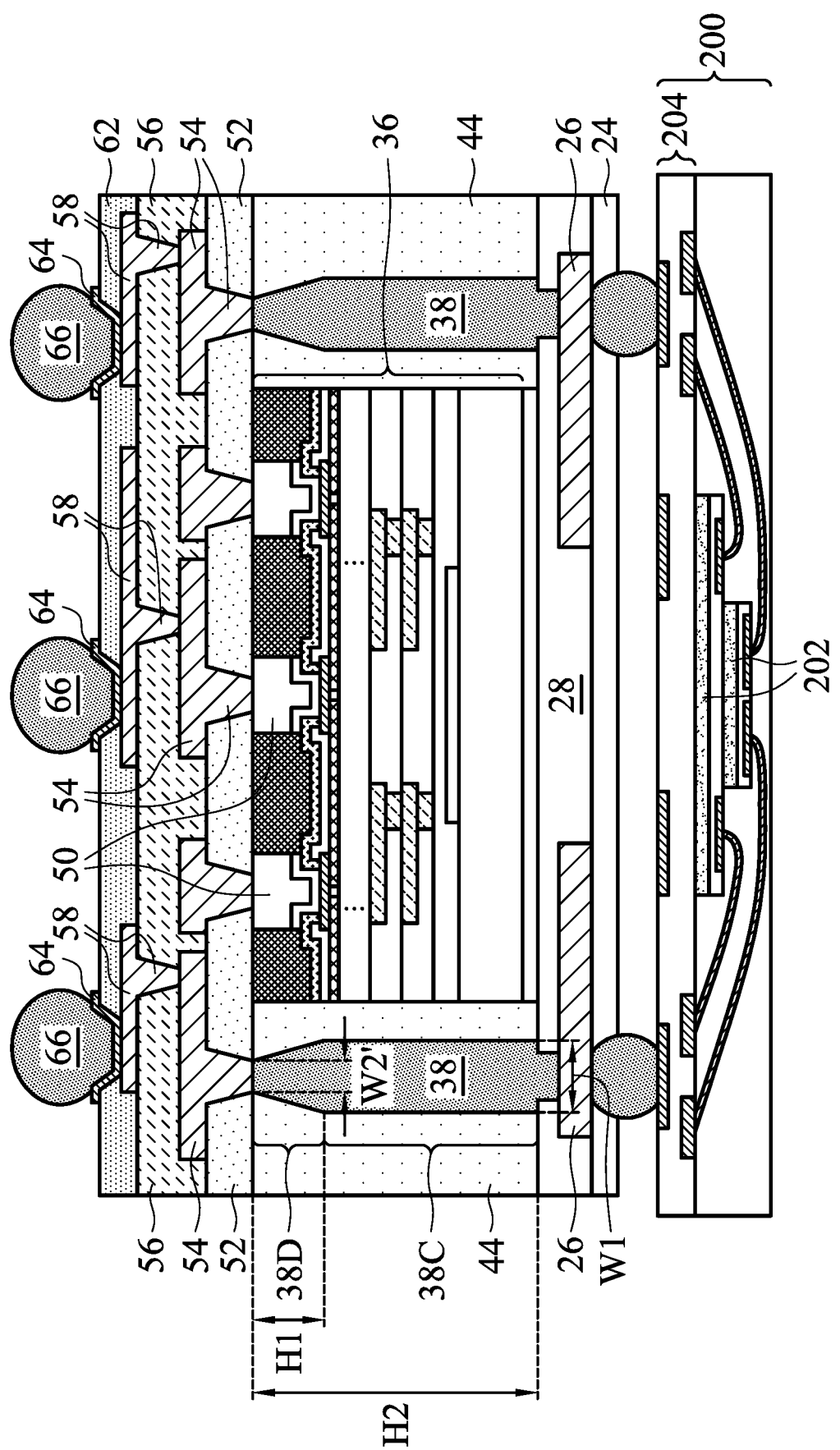

Referring to FIG. 29, through-vias 38 have lower portions 38C and tapered upper portions 38D, which are formed in opening portions 34A and 34B (FIG. 24), respectively. Accordingly, the profiles of lower portions 38C and upper portions 38D are the same as the profiles of the respective lower opening portions 34A and upper opening portions 34B. In accordance with some embodiments of the present disclosure, bottom width W1 and top width W2' of through-vias 38 have difference (W1−W2'), which is smaller than about 50 μm, and may be greater than about 5 μm. Height H1 of the tapered upper portion 38D to height H2 of the entire through-via 38 have ratio H1/H2, which may be smaller than about 0.4 in some embodiments.

Advantageously, with the tapered upper portions 38D of through-vias 38, by forming tapered upper 4 portions for through-vias, the sheer stress applied to RDLs by the through-vias is reduced, and the reliability of the resulting package is improved.

In accordance with some embodiments of the present disclosure, a package includes a device die, a through-via having a sand timer profile, and a molding material molding the device die and the through-via therein, wherein a top surface of the molding material is substantially level with a top surface of the device die. A dielectric layer overlaps the molding material and the device die. A plurality of RDLs extends into the dielectric layer to electrically couple to the device die and the through-via.

In accordance with alternative embodiments of the present disclosure, a package includes a device die, and a through-via including a through-via body and a through-via cap over and connected to the through-via body. The through-via cap is wider than the through-via body. The package further includes a molding material molding the device die and the through-via therein, wherein a top surface of the molding material is substantially level with a top surface of the device die. A dielectric layer overlaps the molding material and the device die, with a bottom surface of the dielectric layer contacting the top surface of the device die and the top surface of the molding material. A plurality of RDLs extends into the dielectric layer to electrically couple to the device die and the through-via.

In accordance with yet alternative embodiments of the present disclosure, a package includes a device die, and a through-via including a lower portion having a first sidewall with a first tilting angle and an upper portion over and connected to the lower portion. The upper portion has a second sidewall having a second tilting angle smaller than the first tilting angle. The package further includes a molding material molding the device die and the through-via therein, wherein a top surface of the molding material is substantially level with a top surface of the device die. A dielectric layer overlaps the molding material and the device die. A plurality of RDLs extends into the dielectric layer to electrically couple to the device die and the through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package, the method comprising:
    depositing a metal seed layer over a carrier;
    forming a plating mask over the metal seed layer;
    patterning the plating mask to form a first opening, wherein the first opening has a top portion having a first width, and a bottom portion having a second width different from the first width;
    plating a metal post in the first opening;
    removing the plating mask;
    etching portions of the metal seed layer; and
    encapsulating the metal post in an encapsulating material.

2. The method of claim 1 further comprising:
    depositing a first dielectric layer over the carrier; and
    forming a second opening in the first dielectric layer, wherein the metal seed layer comprises a first portion over the first dielectric layer and a second portion extending into the second opening, wherein in the plating, a metallic material is plated into the second opening.

3. The method of claim 1, wherein the metal post comprises:
    a body portion in the first opening of the plating mask; and
    a cap portion wider than the body portion, wherein the cap portion is over a top surface of the plating mask.

4. The method of claim 3 further comprising:
    planarizing the encapsulating material, wherein in the planarizing, an upper part of the cap portion is removed, and a lower part of the cap portion is remained.

5. The method of claim 3, wherein after the metal post is plated, the cap portion of the metal post has a bottom surface contacting the plating mask.

6. The method of claim 3, wherein a top surface of the cap portion has a convex shape.

7. The method of claim 1, wherein the first opening comprises:
    a lower portion with a first sidewall having a first tilting angle, wherein the first tilting angle is substantially a right angle, and the lower portion has a substantially uniform width; and
    an upper portion over and connected to the lower portion, wherein the upper portion has a second sidewall having a second tilting angle smaller than the first tilting angle.

8. The method of claim 7, wherein higher parts of the upper portion are increasingly narrower than respective lower parts of the upper portion, and the second sidewall that is tilted is physically joined to the first sidewall that is substantially straight and vertical.

9. A method of forming a package, the method comprising:
    forming a plating mask over a carrier;
    forming an opening in the plating mask;
    plating a metal post over the carrier, wherein the metal post comprises a first portion, and the first portion comprises:
        a middle part having a smallest width;
        an upper part over the middle part, with the upper part having a top end, wherein from the middle part to the top end, widths of the upper part continuously increase; and
        a lower part underlying the middle part, with the lower part having a bottom end, wherein from the middle part to the bottom end, widths of the lower part continuously increase;
    placing a device die over the carrier;
    dispensing an encapsulant to cover the metal post and the device die;
    planarizing the encapsulant until the metal post is exposed; and
    forming redistribution lines over and electrically coupling to the metal post and the device die.

10. The method of claim 9, wherein the metal post is plated until the opening is filled by the first portion of the metal post, and a second portion of the metal post is plated to be higher than a top surface of the plating mask.

11. The method of claim 9, wherein substantially an entirety of a sidewall of the opening is curved.

12. The method of claim 9, wherein the metal post further comprises:
    a second portion over and connected to the first portion, wherein the second portion is wider than the first portion, with a bottom surface of the second portion coplanar with the top end of the first portion, wherein an entirety of the first portion is narrower than the second portion.

13. The method of claim 12, wherein after the planarizing, a portion of the second portion of the metal post remains to be in the encapsulant.

14. A method of forming a package, the method comprising:
    depositing a metal seed layer over a carrier;
    forming a plating mask over the metal seed layer;
    patterning the plating mask to form an opening;
    plating a metal post in the opening, wherein the metal post comprises a body portion filling the opening, and a cap portion over the plating mask;

removing the plating mask;
etching portions of the metal seed layer;
encapsulating the metal post in a molding compound; and
performing a planarization process on the molding compound to reveal the metal post.

15. The method of claim 14, wherein after the plating, plating mask has a planar top surface, and the cap portion comprises a bottom surface contacting the planar top surface of the plating mask.

16. The method of claim 14, wherein after the plating, the cap portion comprises a curved top surface, and in the planarization process, a top portion of the curved top surface is removed, and a bottom portion of the curved top surface remains.

17. The method of claim 14, wherein an entirety of the metal post comprising the cap portion is encapsulated by the molding compound.

18. The method of claim 14, wherein the opening has a curved sidewall.

19. The method of claim 18, wherein the opening comprises:
   a middle part having a smallest width;
   an upper part over the middle part, with the upper part having a top end, wherein from the middle part to the top end, widths of the upper part continuously increase; and
   a lower part underlying the middle part, with the lower part having a bottom end, wherein from the middle part to the bottom end, widths of the lower part continuously increase.

20. The method of claim 9, wherein the upper part and the lower part have curved concave sidewalls.

* * * * *